(12) United States Patent
Hwang et al.

(10) Patent No.: US 11,551,762 B2
(45) Date of Patent: *Jan. 10, 2023

(54) MEMORY DEVICE AND METHOD OF OPERATING THE SAME

(71) Applicant: SK hynix Inc., Gyeonggi-do (KR)

(72) Inventors: Sung Hyun Hwang, Gyeonggi-do (KR); Jin Haeng Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/235,282

(22) Filed: Apr. 20, 2021

(65) Prior Publication Data
US 2022/0122669 A1 Apr. 21, 2022

(30) Foreign Application Priority Data
Oct. 20, 2020 (KR) .................. 10-2020-0136182

(51) Int. Cl.
*G11C 16/10* (2006.01)
*G11C 7/10* (2006.01)
*G11C 16/26* (2006.01)
*G11C 16/08* (2006.01)

(52) U.S. Cl.
CPC .......... *G11C 16/102* (2013.01); *G11C 7/1063* (2013.01); *G11C 16/08* (2013.01); *G11C 16/26* (2013.01)

(58) Field of Classification Search
None
See application file for complete search history.

(56) References Cited

U.S. PATENT DOCUMENTS

| 2013/0077402 A1* | 3/2013 | Izumi | G11C 16/0483 365/185.12 |
| 2020/0219575 A1* | 7/2020 | Ha | G11C 29/787 |
| 2022/0122670 A1* | 4/2022 | Hwang | G11C 7/1063 |

FOREIGN PATENT DOCUMENTS

| KR | 10-1261008 | 5/2013 |
| KR | 10-2053953 | 12/2019 |

OTHER PUBLICATIONS

Office Action for the U.S. Appl. No. 17/381,359 issued by the USPTO dated Aug. 18, 2022.

* cited by examiner

*Primary Examiner* — Tan T. Nguyen
(74) *Attorney, Agent, or Firm* — IP & T Group LLP

(57) ABSTRACT

Provided herein may be a memory device capable of completing a foggy-fine program operation in one ready/busy period. The memory device may include a plurality of memory cells configured to form a plurality of pages, a peripheral circuit configured to perform a first program operation on a page adjacent to a selected page among the plurality of pages, and perform a second program operation on the selected page and control logic configured to control the peripheral circuit, during the first program operation, to successively receive least significant bit (LSB) page data, center significant bit (CSB) page data, and most significant bit (MSB) page data from a memory controller, and program the LSB page data to the page adjacent to the selected page and during the second program operation, to program the LSB page data programmed to the page adjacent to the selected page, the CSB page data and the MSB page data to the selected page.

20 Claims, 17 Drawing Sheets

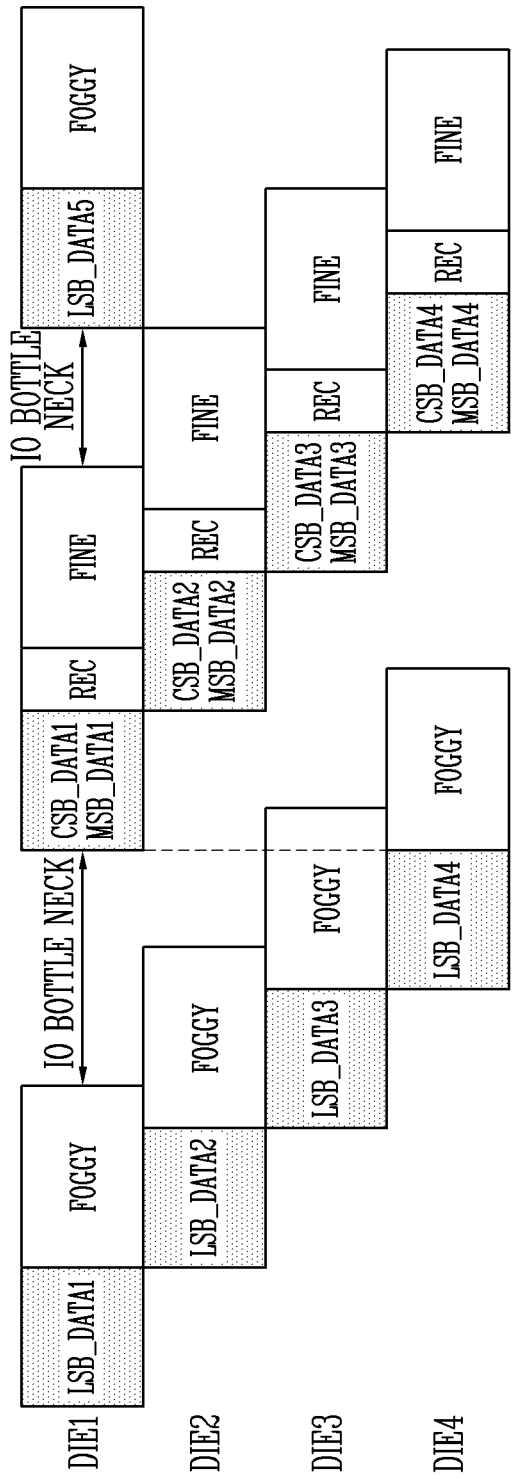

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0136182, filed on Oct. 20, 2020, which is incorporated herein by reference in its entirety.

BACKGROUND

Field of Invention

One or more embodiments described herein relate to a memory device and a method of operating a memory device.

Description of Related Art

A storage device may store data under control of a host device, such as a computer, a smartphone, or a smartpad. Examples of storage devices include hard disk drives (HDDs) which store data on a magnetic disk and a solid state drives (SSDs) or memory cards which store data in a semiconductor memory, e.g., a nonvolatile memory.

The storage device may include a memory controller to control storage of data in a memory device. Memory devices may be classified as volatile memories and nonvolatile memories. Representative examples of nonvolatile memories include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc.

SUMMARY

Various embodiments of the present disclosure are directed to a memory device capable of completing a foggy-fine program operation in one ready/busy period, and a method of operating the memory device.

An embodiment of the present disclosure may provide for a memory device including: a plurality of memory cells configured to form a plurality of pages, a peripheral circuit configured to perform a first program operation on a page adjacent to a selected page among the plurality of pages, and perform a second program operation on the selected page and control logic configured to control the peripheral circuit, during the first program operation, to successively receive least significant bit (LSB) page data, center significant bit (CSB) page data, and most significant bit (MSB) page data from a memory controller, and program the LSB page data to the page adjacent to the selected page and during the second program operation, to program the LSB page data programmed to the page adjacent to the selected page, the CSB page data and the MSB page data to the selected page.

An embodiment of the present disclosure may provide for a memory device including: a plurality of memory cells configured to form a plurality of pages, a peripheral circuit configured to perform first and second program operations on a selected page of the plurality of pages and control logic configured to control the peripheral circuit to perform the first and the second program operations. The control logic may include: an address controller configured to generate a new address based on a target address on which the first and the second program operations are to be performed and a program controller configured to output an operating signal to perform the first and the second program operation based on the new address.

An embodiment of the present disclosure may provide for a method of operating a memory device comprising a plurality of memory cells configured to form a plurality of pages. The method may include: receiving least significant bit (LSB) page data, center significant bit (CSB) page data, and most significant bit (MSB) page data from a memory controller, performing a first program operation of programming the LSB page data to a page adjacent to a selected page among the plurality of pages, performing a recovery operation of reading data programmed to the page adjacent to the selected page and performing a second program operation of programming, to the selected page, data generated by combining the LSB page data, the CSB page data, and the MSB page data.

An embodiment of the present disclosure may provide for a method of operating a memory device, the method comprising, successively receiving least significant bit (LSB) page data, center significant bit (CSB) page data, and most significant bit (MSB) page data from a memory controller, performing a foggy program operation on a page adjacent to a selected page, performing a recovery operation on the page adjacent to the selected page and performing a fine program operation in the selected page, wherein the foggy program operation, recovery operation, and the fine program operation are performed through on busy period.

BRIEF DESCRIPTION OF THE DRAWINGS

FIGS. 8A and 8B are diagrams for describing an I/O bottleneck phenomenon which may occur during a foggy-fine program operation.

DETAILED DESCRIPTION

Structural or functional descriptions in embodiments described herein are introduced only for description of the embodiments of the present disclosure. The descriptions should not be construed as being limited to the embodiments described in the specification or application. Various embodiments will now be described more fully hereinafter with reference to the accompanying drawings, in which preferred embodiments of the present disclosure are shown, so that those of ordinary skill in the art can easily carry out the technical idea of the present disclosure.

Figure 1:
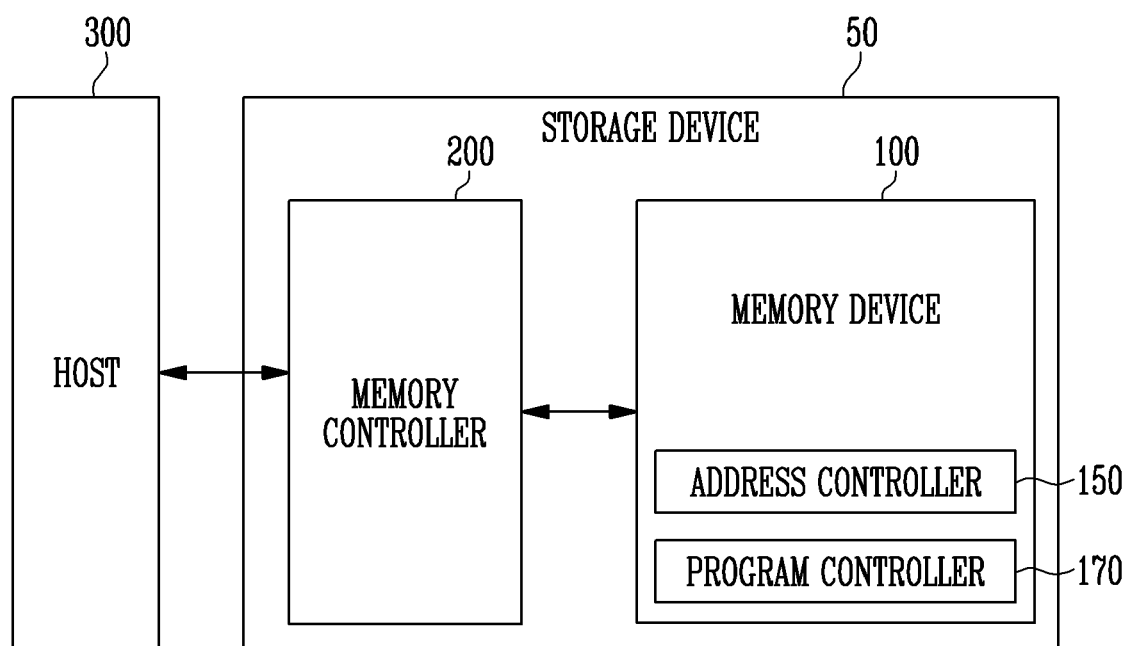
FIG. 1 illustrates an embodiment of a storage device.

FIG. 1 is a block diagram illustrating an embodiment of a storage device 50, which may include a memory device 100 and a memory controller 200. The storage device 50 may store data under control of a host 300. Examples of the host 300 include a cellular phone, a smartphone, an MP3 player, a laptop computer, a desktop computer, a game machine, a TV, a tablet PC, or an in-vehicle infotainment system.

The storage device 50 may be manufactured as any one of various kinds of storage devices depending on a host interface, which is a communication system for communicating with the host 300. For example, the data storage device 50 may be an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured to have any one of various package types. Examples include a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data and perform other operations under control of the memory controller 200. The memory device 100 may include at least one memory cell array including a plurality of memory cells configured to store data. Each memory cell array may include a plurality of memory blocks, with each memory block including a plurality of memory cells. A plurality of memory cells may form a plurality of pages. In an embodiment, each page may be a unit for sorting data in the memory device 100 or reading stored data from the memory device 100. Each memory block may be a unit for erasing data.

Examples of the memory device 100 include a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change random access memory (PRAM), a magnetoresistive random access memory (MRAM), a ferroelectric random access memory (FRAM), or a spin transfer torque random access memory (STT-RAM). For the sake of explanation, it is assumed that memory device 100 is a NAND flash memory.

The memory device 100 may be implemented in a two-dimensional array structure or a three-dimensional array structure. A three-dimensional array structure will be described for illustrative purposes. Embodiments described herein may be applied to a flash memory device in which a charge storage layer is formed of a conductive floating gate (FG), or other types of memory devices such as, but not limited to, a charge trap flash (CTF) memory in which a charge storage layer is formed of an insulating layer.

In an embodiment, the memory device 100 may be operated in a single-level cell (SLC) manner of storing one data bit in each memory cell. In one embodiment, the memory device 100 may be operated to store at least two data bits in each memory cell. For example, the memory device 100 may be operated in a multi-level cell (MLC) manner of storing two data bits in each memory cell, a triple-level cell (TLC) manner of storing three data bits in each memory cell, or a quad-level cell (QLC) manner of storing four data bits in each memory cell.

The memory device 100 may receive commands and addresses from the memory controller 200 and access areas of the memory cell array selected by corresponding ones of the addresses. For example, the memory device 100 may perform an operation corresponding to a command on an area selected by an address. The memory device 100 may perform, for example, a write (program) operation, a read operation, or an erase operation, in response to a received command. For example, when a program command is received, the memory device 100 may program data in an area selected by an address. If a read command is received, the memory device 100 may read data from an area selected by an address. If an erase command is received, the memory device 100 may erase data from an area selected by an address.

The memory device 100 may perform a program operation in a one-shot program scheme or a foggy-fine program scheme. In the case where the memory device 100 performs a program operation in a one-shot program scheme, the memory device 100 may receive all of least significant bit (LSB) page data LSB_DATA, center significant bit (CSB) page data CSB_DATA, and most significant bit (MSB) page data MSB_DATA from the memory controller 200, and then program selected memory cells to target programmed states at the same time.

In the case where the memory device 100 performs a program operation in the foggy-fine program scheme, the memory device 100 may program LSB page data LSB_DATA on a selected page. Subsequently, the memory device 100 may receive CSB page data CSB_DATA and MSB page data MSB_DATA from the memory controller 200, and program memory cells through a foggy program operation and a fine program operation. Thus, the program operations may be successively performed on the selected page.

However, when the one-shot program scheme is used, since memory cells coupled to a selected word line are programmed to target programmed states at the same time, an interference phenomenon may occur on word lines adjacent to the selected word line. Furthermore, when the foggy-fine program scheme is used, since program operations are successively performed on a selected page, an I/O bottleneck phenomenon may occur between data transfer and data program.

In order to prevent the interference phenomenon and an I/O bottleneck phenomenon, one or more embodiments described herein provide a method of controlling an address received from the memory controller 200.

In an embodiment, the memory device 100 may include an address controller 150 which controls an address on which a program operation is to be performed. While the memory device 100 performs a program operation, the memory device 100 may receive, from the memory controller 200, an address and data that correspond to a program command. The address may be, for example, a physical block address (PBA).

In one embodiment, the address controller 150 may control an address received from the memory controller 200, e.g., the address controller 150 may generate a new address based on the address received from the memory controller 200. For example, when the address received from the memory controller 200 is an address corresponding to an N-th (N is a natural number) word line, the address controller 150 may generate and output, to program LSB page data LSB_DATA on an N+1-th (N is a natural number) word line, a new address obtained by combining addresses respectively corresponding to the N+1-th and N-th word lines. The N-th word line may be a target word line.

In an embodiment, the memory device 100 may include a program controller 170 which receives from the address controller 150 an address obtained by combining addresses respectively corresponding to the N+1-th and the N-th word lines, and control a program operation. For example, to program LSB page data LSB_DATA among pieces of data received from the memory controller 200 on the N+1-th word line, the program controller 170 may output an address corresponding to the N+1-th word line and then output an operating signal for instructing a program operation to be performed on the N+1-th word line.

Thereafter, the program controller 170 may output an address corresponding to the N-th word line that is the target word line, and then output an operating signal for instructing to perform, on the N-th word line, a program operation for LSB page data LSB_DATA, CSB page data CSB_DATA, and MSB page data MSB_DATA that are read from the N+1-th word line.

As such, since the LSB page data LSB_DATA is programmed to a word line adjacent to the target word line, the likelihood of an interference phenomenon occurring may be reduced or altogether prevented. Furthermore, the memory device 100 may successively receive the LSB page data LSB_DATA, the CSB page data CSB_DATA, and the MSB page data MSB_DATA from the memory controller 200, so that the likelihood of an I/O bottleneck phenomenon occurring can be reduced or prevented.

The memory controller 200 may control overall operations of the storage device 50. When a power supply voltage is applied to the storage device 50, the memory controller 200 may execute firmware. In the case where the memory device 100 is a flash memory device 100, the memory controller 200 may execute firmware (e.g., a flash translation layer (FTL)) for controlling communication between the host 300 and the memory device 100.

In an embodiment, the memory controller 200 may include firmware which receives data and a logical block address (LBA) from the host 300 and translates the LBA into a physical block address (PBA) indicating addresses of memory cells in which data is to be stored, with the memory cells being included in the memory device 100. The memory controller 200 may store, in a buffer memory, a logical-physical address mapping table indicating mapping relationship between logical block addresses (LBAs) and physical block addresses (PBAs).

The memory controller 200 may control the memory device 100 to perform a program operation, a read operation, or an erase operation in response to a request from the host 300. For example, if a program request is received from the host 300, the memory controller 200 may change the program request to a program command and provide the program command, a PBA, and data to the memory device 100. If a read request along with an LBA is received from the host 300, the memory controller 200 may change a read request to a read command, select a PBA corresponding to the LBA, and provide the read command and the PBA to the memory device 100. If an erase request along with an LBA is received from the host 300, the memory controller 200 may change the erase request to an erase command, select a PBA corresponding to the LBA, and provide the erase command and the PBA to the memory device 100.

In an embodiment, the memory controller 200 may autonomously generate a program command, an address and data without a request from the host 300, and may transmit them to the memory device 100. For example, the memory controller 200 may provide a command, an address and data to the memory device 100 to perform background operations. Examples of background operations include a program operation for wear leveling and a program operation for garbage collection.

In an embodiment, the storage device 50 may further include a buffer memory. The memory controller 200 may control data exchange between the host 300 and the buffer memory. In one embodiment, the memory controller 200 may temporarily store system data for controlling the memory device 100 in the buffer memory. For example, the memory controller 200 may temporarily store, to the buffer memory, data input from the host 300, and thereafter transmit the data temporarily stored in the buffer memory to the memory device 100.

In various embodiments, the buffer memory may be used as an operating memory or a cache memory of the memory controller 200. The buffer memory may store codes or commands to be executed by the memory controller 200. In one embodiment, the buffer memory may store data to be processed by the memory controller 200. The buffer memory may be, for example, an SRAM or a DRAM such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or a rambus dynamic random access memory (RDRAM).

In various embodiments, the buffer memory may be outside the storage device 50, e.g., volatile memory devices outside the storage device 50 may perform the function of the buffer memory.

In an embodiment, the memory controller 200 may control at least two or more memory devices. In this case, the memory controller 200 may control the memory devices in an interleaving manner so as to enhance operating performance.

The host 300 may communicate with the storage device 50 using at least one of various communication methods. Examples include universal serial bus (USB), serial AT attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multi-media card (MMC), embedded MMC (eMMC), dual in-line memory module (DIMM), registered DIMM (RDIMM), and load reduced DIMM (LRDIMM) communication methods.

Figure 2:
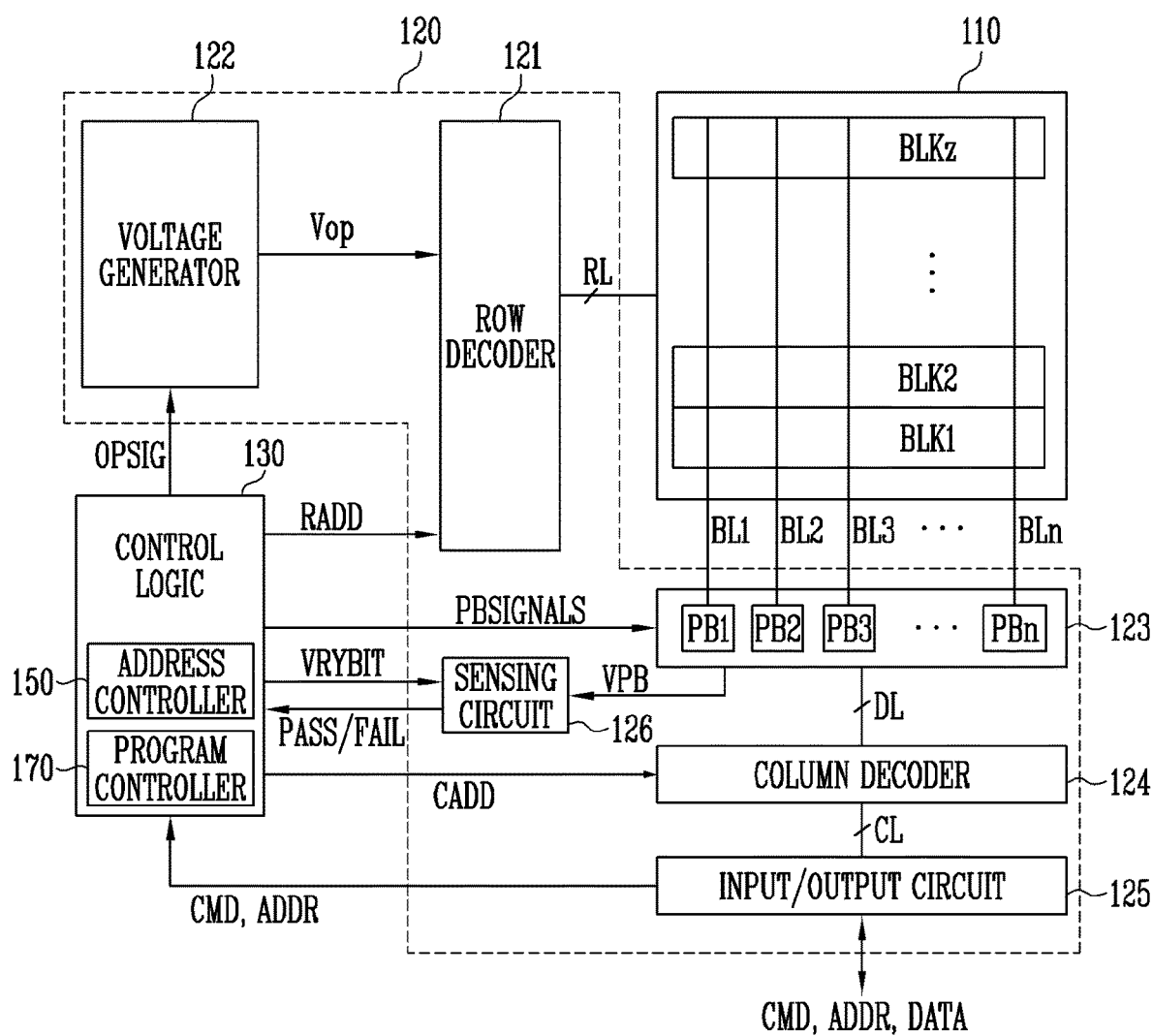
FIG. 2 illustrates an embodiment of a memory device.

FIG. 2 is a diagram illustrating an embodiment of memory device 100 of FIG. 1. Referring to FIG. 2, the memory device 100 may include a memory cell array 110, a peripheral circuit 120, and a control logic 130.

The memory cell array 110 may include a plurality of memory blocks BLK1 to BLKz coupled to a row decoder 121 through row lines RL. The plurality of memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as one page. Hence, each memory block may include a plurality of pages.

The row lines RL may include at least one source select line, a plurality of word lines, and at least one drain select line.

Each of the memory cells included in the memory cell array 110 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may perform a program operation, a read operation, or an erase operation on a selected area of the memory cell array 110 under control of the control logic 130. The peripheral circuit 120 may drive the memory cell array 110. For example, the peripheral circuit 120 may apply various operating voltages to the row lines RL and the bit lines BL1 to BLn or discharge the applied voltages under control of the control logic 130.

The peripheral circuit 120 may include the row decoder 121, a voltage generator 122, the page buffer group 123, a column decoder 124, an input/output circuit 125, and a sensing circuit 126. The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may decode a row address RADD received from the control logic 130. The row decoder 121 may select at least one memory block of the memory blocks BLK1 to BLKz in response to the decoded address. The row decoder 121 may select at least one word line WL of the selected memory block in response to the decoded address, so that voltages generated from the voltage generator 122 are applied to the at least one word line WL.

For example, during a program operation, the row decoder 121 may apply a program voltage to a selected word line and may apply a program pass voltage (having a level different from (e.g., lower than) that of the program voltage) to unselected word lines. During a program verify operation, the row decoder 121 may apply a verify voltage to a selected word line and may apply a verify pass voltage (e.g., higher than the verify voltage) to unselected word lines. During a read operation, the row decoder 121 may apply a read voltage to a selected word line and may apply a read pass voltage (e.g., higher than the read voltage) to unselected word lines.

In an embodiment, an erase operation of the memory device 100 may be performed on a memory block basis. During an erase operation, the row decoder 121 may select one memory block in response to a decoded address. During the erase operation, the row decoder 121 may apply a reference (e.g., ground) voltage to word lines coupled to the selected memory block.

The voltage generator 122 may operate under control of the control logic 130 to generate a plurality of voltages using an external supply voltage supplied to the memory device 100. For example, the voltage generator 122 may generate various operating voltages Vop to be used for a program operation, a read operation, and an erase operation in response to an operating signal OPSIG. In one embodiment, the voltage generator 122 may generate a program voltage, a verify voltage, a pass voltage, a read voltage, an erase voltage, and/or other voltages under control of the control logic 130.

In an embodiment, the voltage generator 122 may generate an internal supply voltage by regulating the external supply voltage. The internal supply voltage may be used, for example, as an operating voltage of the memory device 100.

In an embodiment, the voltage generator 122 may generate a plurality of voltages using an external power supply voltage or an internal power supply voltage. For example, the voltage generator 122 may include a plurality of pumping capacitors for receiving the internal supply voltage and generating a plurality of voltages, by selectively activating the plurality of pumping capacitors under control of the control logic 130. The generated voltages may be supplied to the memory cell array 110 by row decoder 121.

The page buffer group 123 may include first to n-th page buffers PB1 to PBn coupled to the memory cell array 110 through the first to n-th bit lines BL1 to BLn, respectively. The first to n-th page buffers PB1 to PBn may operate under control of the control logic 130. For example, the first to n-th page buffers PB1 to PBn may operate in response to page buffer control signals PBSIGNALS. In one embodiment, the first to n-th page buffers PB1 to PBn may temporarily store data received through the first to n-th bit lines BL1 to BLn or may sense voltages or currents of the first to n-th bit lines BL1 to BLn during a read operation or a verify operation.

During a program operation, the first to n-th page buffers PB1 to PBn may transmit data DATA received through the input/output circuit 125 to selected memory cells through the first to n-th bit lines BL1 to BLn when a program voltage is applied to a selected word line. The memory cells in the selected page are programmed based on the transmitted data DATA. During a program verify operation, the first to n-th page buffers PB1 to PBn may read page data by sensing voltages or currents received from selected memory cells through the first to n-th bit lines BL1 to BLn.

During a read operation, the first to n-th page buffers PB1 to PBn may read data DATA from memory cells of a selected page through the first to n-th bit lines BL1 to BLn, and may output the read data DATA to the data input/output circuit 125 under control of the column decoder 124.

During an erase operation, the first to n-th page buffers PB1 to PBn may float the first to n-th bit lines BL1 to BLn or apply erase voltages thereto.

The column decoder 124 may transmit data between the input/output circuit 125 and the page buffer group 123 in response to a column address CADD. For example, the column decoder 124 may exchange data with the first to n-th page buffers PB1 to PBn through data lines DL or exchange data with the input/output circuit 125 through column lines CL.

The input/output circuit 125 may transmit, to the control logic 130, a command CMD or an address ADDR received from the memory controller (e.g., 200 of FIG. 1) described with reference to FIG. 1, or may exchange data DATA with the column decoder 124.

During a read operation or a verify operation, the sensing circuit 126 may generate a reference current in response to an enable bit signal VRYBIT, and may compare a sensing voltage VPB received from the page buffer group 123 with a reference voltage generated by the reference current and output a pass signal PASS or a fail signal FAIL.

The control logic 130 may output an operating signal OPSIG, a row address RADD, page buffer control signals PBSIGNALS, and an enable bit signal VRYBIT in response to a command CMD and an address ADDR, and may control the peripheral circuit 120 accordingly. For example, the control logic 130 may control a read operation of a selected memory block in response to a sub-block read command and an address. The control logic 130 may control an erase operation of a selected sub-block, included in a selected memory block, in response to a sub-block erase command and an address. In addition, the control logic 130 may determine whether a target memory cell has passed a verification during a verify operation in response to a pass signal PASS or a fail signal FAIL.

In an embodiment, the control logic 130 may include an address controller 150 and a program controller 170. In an embodiment, the address controller 150 and the program controller 170 may be outside the control logic 130. For example, the address controller 150 may be in the row decoder 121. In one embodiment, the address controller 150 and the program controller 170 may be in the peripheral circuit 120.

In an embodiment, the address controller 150 may control an address ADDR received from the memory controller (e.g., 200 of FIG. 1). For example, the address controller 150 may generate a new address based on the address that is received from the memory controller (e.g., 200 of FIG. 1) and corresponds to the selected word line. The address generated from the address controller 150 may be an address obtained by combining addresses respectively corresponding to the selected word line and a word line adjacent to the selected word line.

In an embodiment, the program controller 170 may control the peripheral circuit 120 to perform a program operation based on the address generated from the address controller 150. For example, the program controller 170 may control the peripheral circuit 120 to program the LSB page data LSB_DATA to the memory cells of the word line adjacent to the selected word line and then may read data programmed to the memory cells of the adjacent word line.

Subsequently, the program controller 170 may control the peripheral circuit 120 to program, on the memory cells of the selected word line, the read LSB page data LSB_DATA, the CSB page data CSB_DATA and the MSB page data MSB_DATA that are received from the memory controller (e.g., 200 of FIG. 1).

By the above-mentioned program operation, the likelihood of an interference phenomenon occurring may be reduced or prevented on the memory cells of the word line adjacent to the selected word line on which the program operation is performed. Also, an I/O bottleneck phenomenon may be prevented from occurring when the memory device performs program operations on a plurality of dies.

Figure 3:
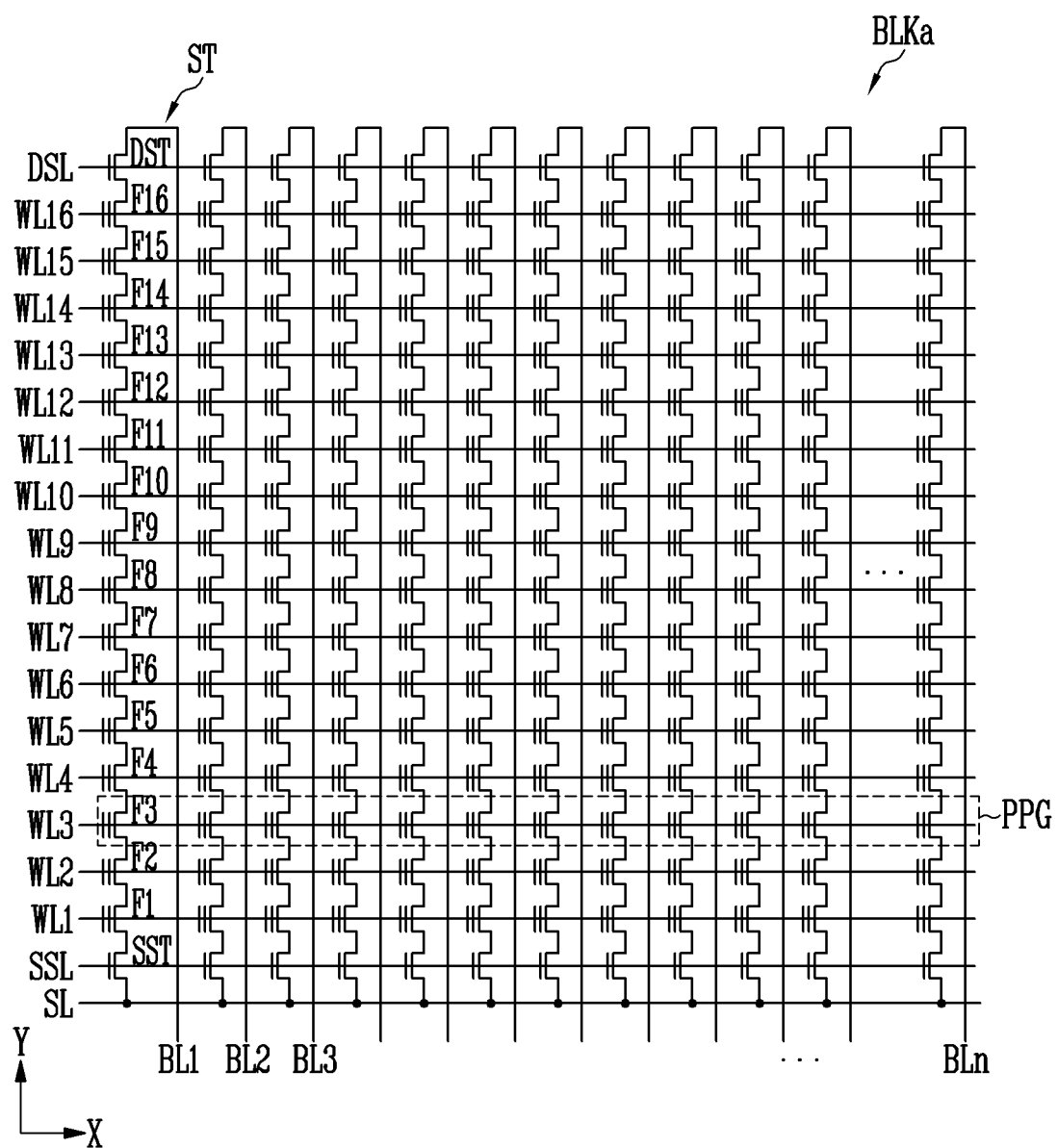
FIG. 3 illustrates an embodiment of a memory cell array.

FIG. 3 is a diagram illustrating an embodiment of the memory cell array 110 of FIG. 2, and particularly a memory block BLKa which may be representative of the plurality of memory blocks BLK1 to BLKz in the memory cell array 110 of FIG. 2.

The memory block BLKa may be coupled with a first select line, word lines, and a second select line arranged parallel to each other. For example, the word lines may be arranged parallel to each other between the first and second select lines. The first select line may be a source select line SSL, and the second select line may be a drain select line DSL.

The memory block BLKa may include a plurality of strings coupled between the bit lines BL1 to BLn and the source line SL. The bit lines BL1 to BLn may be respectively coupled to the strings, and the source lines SL may be coupled in common to the strings. The strings may have the same configuration. The string ST coupled to the first bit line BL1 will be described by way of example.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST. In one embodiment, a larger number of memory cells than the number of memory cells F1 to F16 shown in the drawing may be included in each string ST.

The source select transistor SST may have a source coupled to the source line SL, and the drain select transistor DST may have a drain coupled to the first bit line BL1. The memory cells F1 to F16 may be coupled in series between the source select transistor SST and the drain select transistor DST. Gates of the source select transistors in different strings may be coupled to the source select line SSL, gates of the drain select transistors may be coupled to the drain select line DSL, and gates of the memory cells F1 to F16 may be coupled to the plurality of word lines WL1 to WL16. Among the memory cells in different strings, a group of memory cells coupled to each word line may be referred to as a physical page PPG. Therefore, the number of physical pages in the memory block BLKa may correspond to the number of word lines WL1 to WL16.

Each memory cell may store 1-bit data. This type of memory cell may be called a single level cell (SLC). Each physical page PPG may store data of a single logical page LPG. Data of each logical page LPG may include data bits corresponding to the number of memory cells in a single physical page PPG. Furthermore, each memory cell may store 2- or more-bit data. This memory cell is typically called a multi-level cell (MLC). In this case, each physical page PPG may store data of two or more logical pages LPG.

A memory cell capable of storing 2-bit data may be referred to as a multi-level cell (MLC). In one embodiment, an MLC cell may be a memory cell capable of storing 2-bit data, a memory cell capable of storing 3-bit data may be called a triple level cell (TLC), and a memory cell capable of storing 4-bit data may be called a quadruple level cell (QLC). In one embodiment, a memory cell scheme may store a plurality of bits of data in each memory cell. Accordingly, embodiments of memory device 100 may be implemented to include 2- or more-bit data stored in each memory cell.

In an embodiment, each memory block may have a three-dimensional structure. Each memory block may include a plurality of memory cells stacked on a substrate, with the memory cells arranged in a +X direction, a +Y direction, and a +Z direction.

Figure 4:
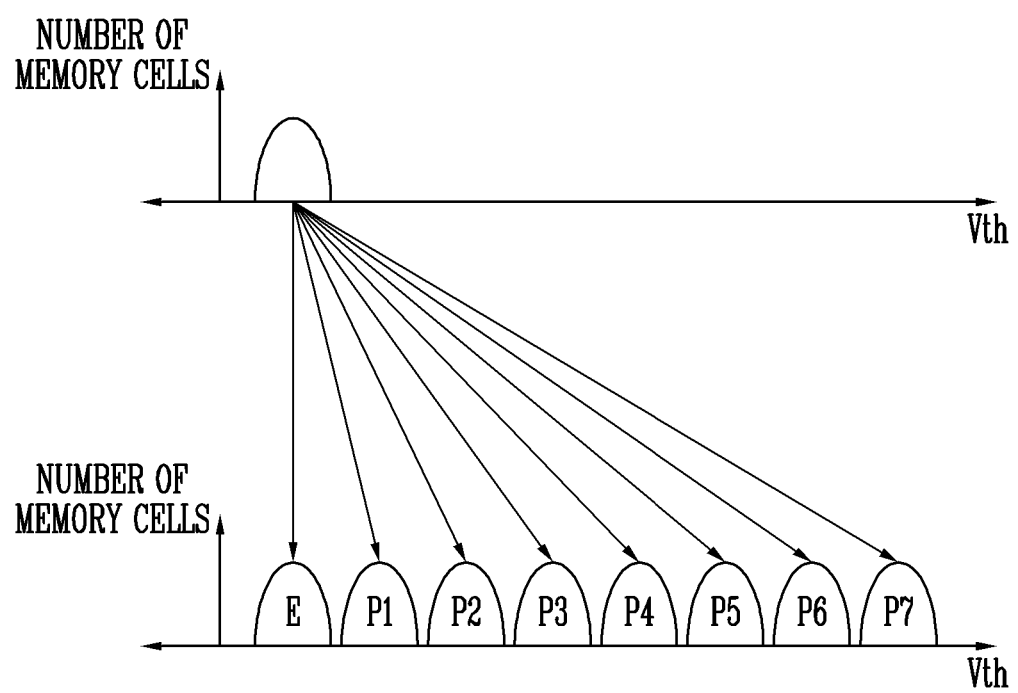
FIG. 4 illustrates an embodiment describing a one-shot program.

FIG. 4 illustrates an example of a one-shot program, and more particularly, a process of programming each of a plurality of memory cells having an erased state E to a target programmed state through a one-shot program operation. In FIG. 4, the horizontal axis indicates the threshold hold level Vth of memory cells and the vertical axis indicates the number of memory cells.

Referring to FIG. 4, it is assumed that the memory device (e.g., 100 of FIG. 1) performs a program operation in a triple level cell (TLC) scheme in which three data bits are stored in each memory cell Also, FIG. 4 may be applied to the case where the memory device (e.g., 100 of FIG. 1) is operated in a single level cell (SLC) scheme, in which a single data bit is stored in each memory cell, a multi-level cell (MLC) scheme in which two data bits are stored in each memory cell, or a quadruple level cell (QLC) scheme in which four data bits are stored in each memory cell.

In an embodiment, the memory device (e.g., 100 of FIG. 1) may perform a one-shot program operation on a selected memory cell. Selected memory cells may be in the erased state E before being programmed. For example, each of the selected memory cells may be programmed from the erased state E to any one programmed state of first to seventh programmed states P1 to P7, e.g., the target programmed state of each of the selected memory cells may be any one of the first to seventh programmed states P1 to P7.

In the present case, since the memory device (e.g., 100 of FIG. 1) performs a one-shot program operation, the selected memory cells may be respectively programmed to the target programmed states. For example, each of the selected memory cells may be programmed from the erased state E to any one programmed state of first to seventh programmed states P1 to P7.

In order to program the selected memory cells at the same time, the potential of a bit line coupled to each selected memory cell may be set to a different value depending on the target programmed state of the coupled memory cell. For example, as the target programmed state of the selected memory cell becomes higher, the voltage level of the bit line coupled to the corresponding memory cell may be set to a lower value. As the target programmed state of the selected memory cell becomes lower, the voltage level of the bit line coupled to the corresponding memory cell may be set to a higher value.

As such, in the case where the selected memory cells are programmed by the one-shot program operation, the number of program loops to be performed on the selected memory cells may be reduced.

However, when the one-shot program operation is performed, an interference phenomenon and/or an I/O bottleneck phenomenon may occur on memory cells of a word line adjacent to the word line coupled to the selected memory cells. Therefore, when the one-shot program operation is used, the interference phenomenon may reduce the reliability of the data programmed to the memory cells or the speed of the program operation.

Figure 5:
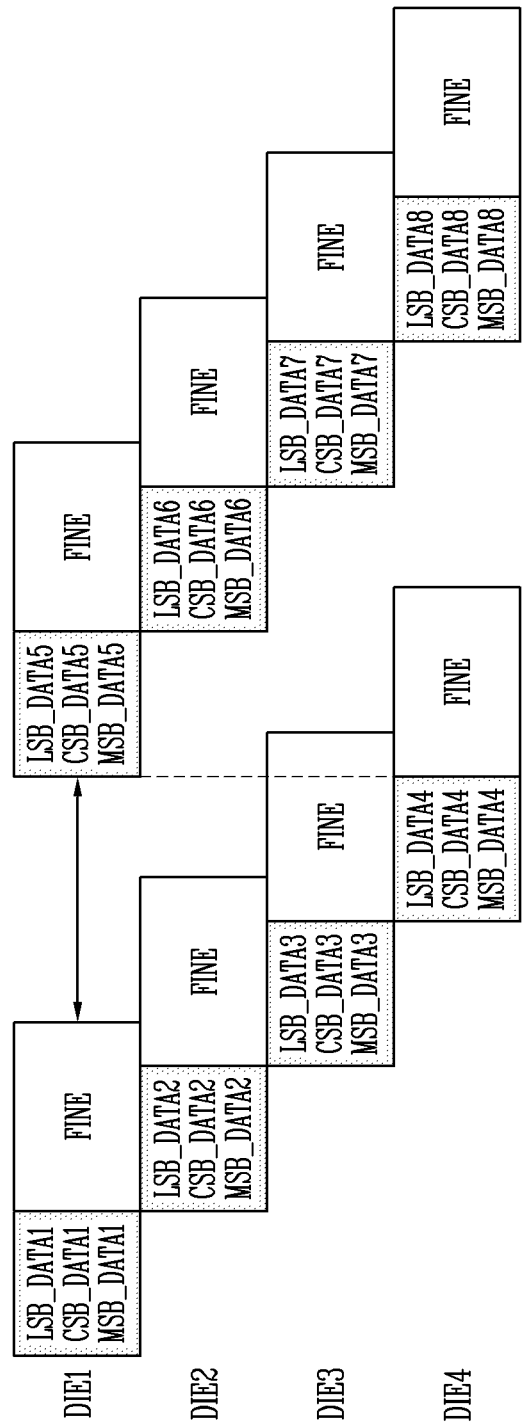
FIG. 5 illustrates an example of an I/O bottleneck phenomenon.

FIG. 5 is a diagram describing an example of an I/O bottleneck phenomenon which may occur during the one-shot program of FIG. 4. When the memory device (e.g., 100 of FIG. 1) includes a plurality of dies, a program operation may be performed on each die. The program operation that is performed on each die may be a one-shot program operation FINE.

Referring to FIG. 5, the memory device (e.g., 100 of FIG. 1) may be coupled with the memory controller (e.g., 200 of FIG. 1) through a plurality of channels. At least one die may be coupled to each of the plurality of channels. Each of the plurality of dies may include at least one or more planes, and each plane may include a plurality of memory blocks.

In FIG. 5, it is assumed that the memory controller (e.g., 200 of FIG. 1) and the memory device (e.g., 100 of FIG. 1) are coupled to each other through the first to fourth channels, and each channel is coupled to one die. For example, a die coupled to the first channel may be a first die DIE1, a die coupled to the second channel may be a second die DIE2, a die coupled to the third channel may be a third die DIE3, and a die coupled to the fourth channel may be a fourth die DIE4.

In an embodiment, program operations may be successively performed on the first to fourth dies DIE1 to DIE4. A program scheme to be performed may be an interleaving scheme. For example, the memory device (e.g., 100 of FIG. 1) may receive, from the memory controller (e.g., 200 of FIG. 1), data to be programmed to the first die DIE1. Data received from the memory controller (e.g., 200 of FIG. 1) may be first LSB page data LSB_DATA1, first CSB page data CSB_DATA1, and first MSB page data MSB_DATA1.

Thereafter, the memory device (e.g., 100 of FIG. 1) may program data received from the memory controller (e.g., 200 of FIG. 1) and simultaneously receive data to be programmed to the second die DIE2. Data to be programmed to the second die DIE2 may be second LSB page data LSB_DATA2, second CSB page data CSB_DATA2, and second MSB page data MSB_DATA2.

In the same manner as described above, the memory device (e.g., 100 of FIG. 1) may program data to the second die DIE2 and simultaneously receive third LSB page data LSB_DATA3, third CSB page data CSB_DATA3, and third MSB page data MSB_DATA3 to be programmed to the third die DIE3. The memory device (e.g., 100 of FIG. 1) may program data to the third die DIE3 and simultaneously receive fourth LSB page data LSB_DATA4, fourth CSB page data CSB_DATA4, and fourth MSB page data MSB_DATA4 to be programmed to the fourth die DIE4.

Thereafter, the memory device (e.g., 100 of FIG. 1) may program data to the fourth die DIE4 and simultaneously receive data to be programmed to the first die DIE1. However, since the program operations are performed on the first to fourth dies DIE1 to DIE4 in the interleaving scheme, after a lot of time has passed after data has been programmed to the first die DIE1, a program operation can be performed again. In other words, until the program operation is resumed on the first die DIE1, a long time (e.g., consumed to perform program operations on the second to fourth dies DIE2 to DIE4) may pass.

Moreover, since the selected memory cells are programmed at the same time by a one-shot program operation, an interference phenomenon may occur on the memory cells of the word line adjacent to the selected word line.

Figure 6:
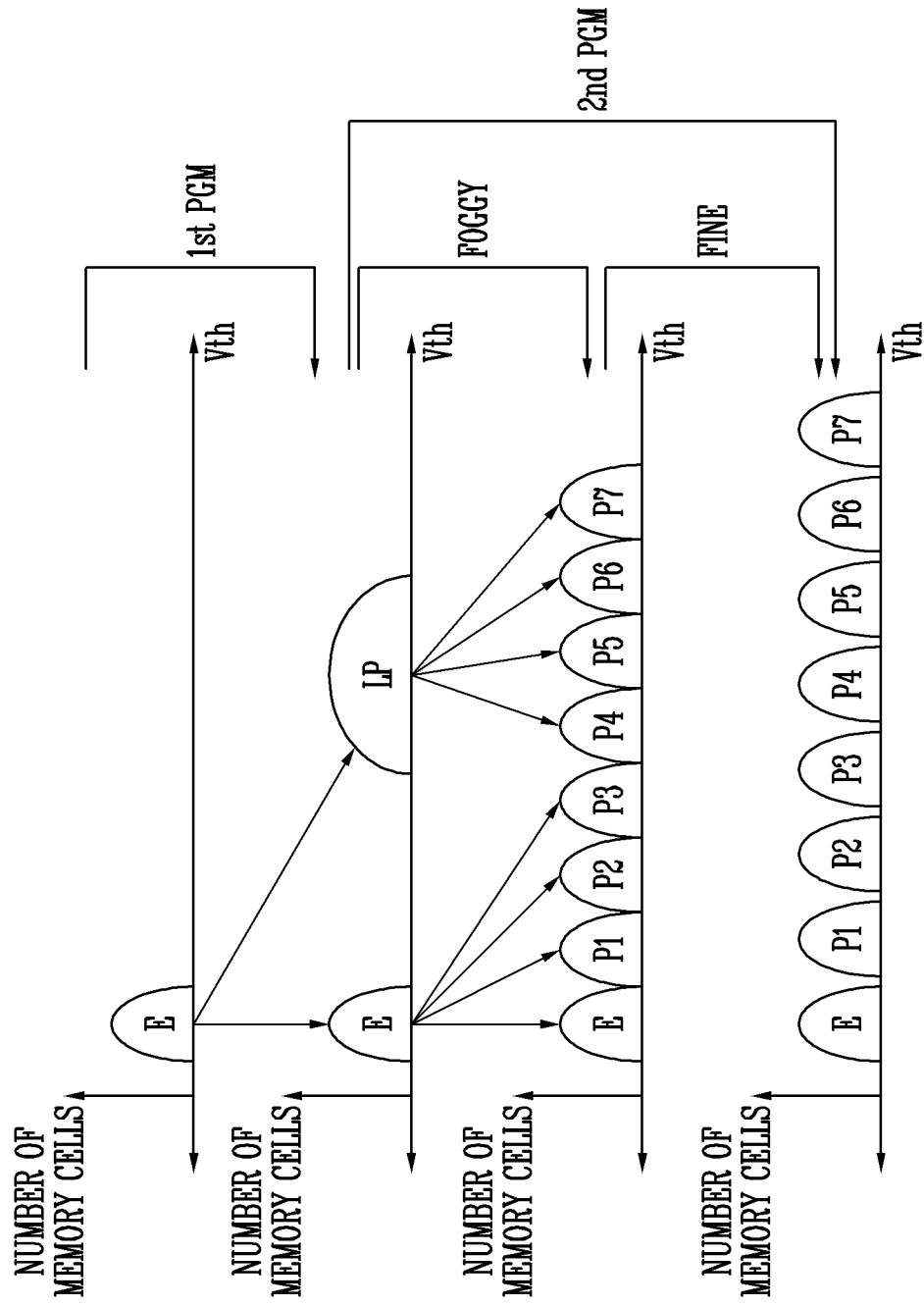
FIG. 6 illustrates an embodiment describing a foggy-fine program.

FIG. 6 is a diagram for describing an embodiment of a foggy-fine program. In FIG. 6, the horizontal axis indicates the threshold hold level Vth of memory cells and the vertical axis indicates the number of memory cells. Also, it is assumed that the memory cells are programmed in a TLC scheme. In some embodiments, FIG. 6 may be applied to the case where the program operation is performed in a SLC scheme, a MLC scheme, or a QLC scheme.

Referring to FIG. 6, memory cells may be in an erased state E before being programmed. Each of the memory cells that are in the erased state E may be programmed, for example, to one of the first to seventh programmed states P1 to P7, that are target programmed states, through a foggy-fine operation.

First, LSB page data may be programmed to the memory cells that are in the erased state E. Here, an operation that is performed may be a first program operation $1^{st}$ PGM. For example, before the foggy-fine program operation is performed, the LSB page data may be programmed to the memory cells. Therefore, if the LSB page data is programmed to the memory cells that are in the erased state E, the memory cells may enter either the erased state E or an LP programmed state LP.

Subsequently, the program operation that is performed may be a second program operation $2^{nd}$ PGM. The second program operation $2^{nd}$ PGM may include a foggy program operation FOGGY and a fine program operation FINE.

In an embodiment, the memory device (e.g., 100 of FIG. 1) may receive a foggy program command corresponding to a foggy-fine program request from the memory controller (e.g., 200 of FIG. 1) and perform the foggy program operation FOGGY. By the foggy program operation FOGGY, the memory cells that are in the erased state E may be programmed to the first to third programmed states P1 to P3, and the memory cells that are in the LP programmed state LP may be programmed to the fourth to seventh programmed states P4 to P7.

If the foggy program operation FOGGY is completed, the memory device (e.g., 100 of FIG. 1) may receive a fine program command corresponding to the foggy-fine program request from the memory controller (e.g., 200 of FIG. 1) and perform the fine program operation FINE.

In an embodiment, by the fine program operation FINE, threshold voltage distributions of the memory cells that are in the erased state E and the first to seventh programmed states P1 to P7 may be more minutely adjusted. For example, when the memory cells that are in the erased state E and the first to seventh programmed states P1 to P7 are programmed by the foggy program operation FOGGY, the threshold voltage distributions may not be clearly separated from each other. However, the threshold voltage distributions of the memory cells that are in the erased state E and the first to seventh programmed states P1 to P7 may be clearly separated from each other by the fine program operation FINE.

As a result, when the memory device (e.g., 100 of FIG. 1) performs the foggy-fine program operation, each of the memory cells may have, after LSB page data is programmed thereto, one of the erased state E and the first to seventh programmed states P1 to P7 through the operations corresponding to the foggy program command and the fine program command.

Figure 7A:
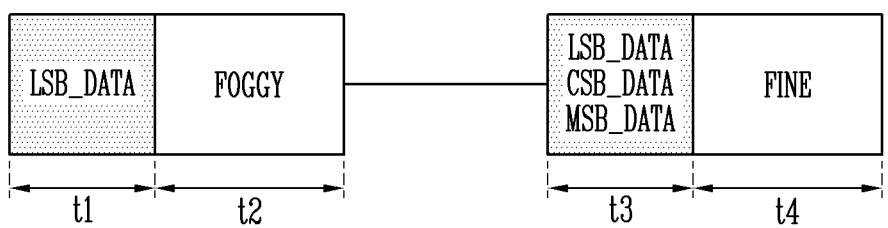
FIGS. 7A and 7B illustrate an embodiment of a foggy-fine program.
Figure 7B:
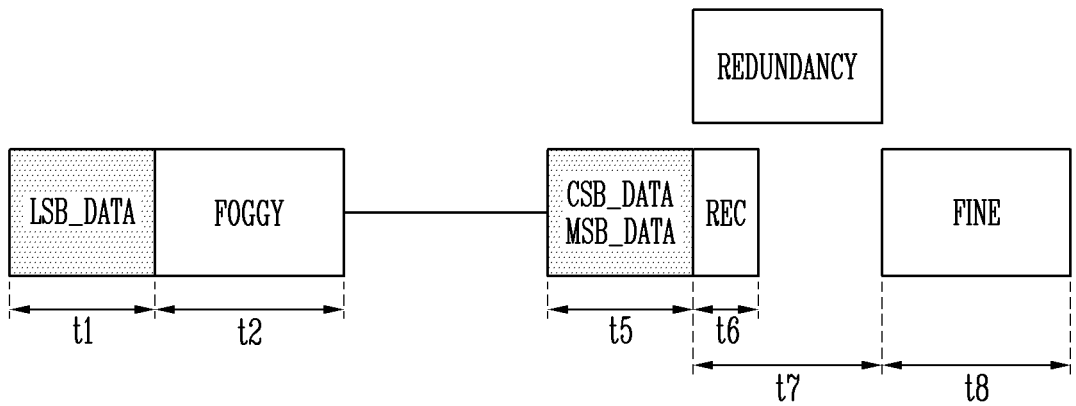

FIGS. 7A and 7B illustrate an embodiment of the foggy-fine program operation of FIG. 6, where a process is implemented for programming selected memory cells when the selected memory cells are programmed by the foggy-fine program operation.

Referring to FIGS. 6, 7A and 7B, FIGS. 7A and 7B illustrate a second program operation ($2^{nd}$ PGM of FIG. 6) that is performed, during the foggy-fine program operation, after a first program operation ($1^{st}$ PGM of FIG. 6) of programming the LSB page data. For example, FIGS. 7A and 7B illustrate the foggy program operation FOGGY and the fine program operation FINE included in the second program operation (e.g., $2^{nd}$ PGM of FIG. 6).

Referring to FIGS. 7A and 7B, during the foggy-fine program operation, LSB page data LSB_DATA may be input to the memory device (e.g., 100 of FIG. 1) during time t1. If the LSB page data LSB_DATA has been input to the memory device (e.g., 100 of FIG. 1), the LSB page data LSB_DATA may be programmed during time t2. Here, a program operation that is performed may be a foggy program operation FOGGY.

After the foggy program operation FOGGY has been completed, the LSB page data LSB_DATA, CSB page data CSB_DATA, and MSB page data MSB_DATA may be input to the memory device (e.g., 100 of FIG. 1) during time t3. If the LSB page data LSB_DATA, the CSB page data CSB_DATA, and the MSB page data MSB_DATA have been input to the memory device (e.g., 100 of FIG. 1), the input data may be programmed during time t4. Here, a program operation that is performed may be a fine program operation FINE.

Referring to FIG. 7A, the LSB page data LSB_DATA is input to the memory device (e.g., 100 of FIG. 1), and thereafter the LSB page data LSB_DATA, the CSB page data CSB_DATA, and the MSB page data MSB_DATA are input thereto. In this way, the foggy-fine program operation may be performed.

Referring to FIG. 7B, in the same manner as FIG. 7A, during the foggy-fine program operation, LSB page data LSB_DATA is input to the memory device (e.g., 100 of FIG. 1) during time t1 and the LSB page data LSB_DATA may be programmed during time t2. Here, a program operation that is performed may be a foggy program operation FOGGY.

After the foggy program operation FOGGY has been completed, CSB page data CSB_DATA and MSB page data MSB_DATA may be input to the memory device (e.g., 100 of FIG. 1) during time t5. Unlike FIG. 7A, in FIG. 7B, only the CSB page data CSB_DATA and the MSB page data MSB_DATA may be input to the memory device (e.g., 100 of FIG. 1), and the LSB page data LSB_DATA may not be input thereto.

However, compared to FIG. 7A, the overall time consumed in the case of FIG. 7B may increase due to the time it takes to read the LSB page data LSB_DATA and the time it takes to combine the LSB page data LSB_DATA, the CSB page data CSB_DATA, and the MSB page data MSB_DATA.

For example, during time t6, the LSB page data LSB_DATA may be obtained by a recovery operation REC. The recovery operation REC may be an operation of reading the data programmed during the foggy program operation FOGGY. In other words, the LSB page data LSB_DATA may be received through the recovery operation REC rather than being received from the memory controller (e.g., 200 of FIG. 1).

If the LSB page data LSB_DATA is received, new data may be generated, based on the CSB page data CSB_DATA and the MSB page data MSB_DATA that haven been previously received and the LSB page data LSB_DATA. The new data may be data for which the fine program operation FINE is performed.

In an embodiment, the time it takes to perform the recovery operation REC and generate the new data may be time t7 (referred to as REDUNDANCY). For example, during time t7, the foggy-programmed data may be read and the new data may be generated based on the read data and data input to the memory device (e.g., 100 of FIG. 1).

If the data for which the fine program operation FINE is to be performed is generated, the new data may be programmed during time t8. A program operation that is performed may be a fine program operation FINE.

Referring to FIG. 7B, the LSB page data LSB_DATA may be input to the memory device (e.g., 100 of FIG. 1) and thereafter the foggy-fine program operation may be performed through the new data generated based the read LSB page data LSB_DATA, the input CSB page data CSB_DATA, and the MSB page data MSB_DATA.

Figure 8A:
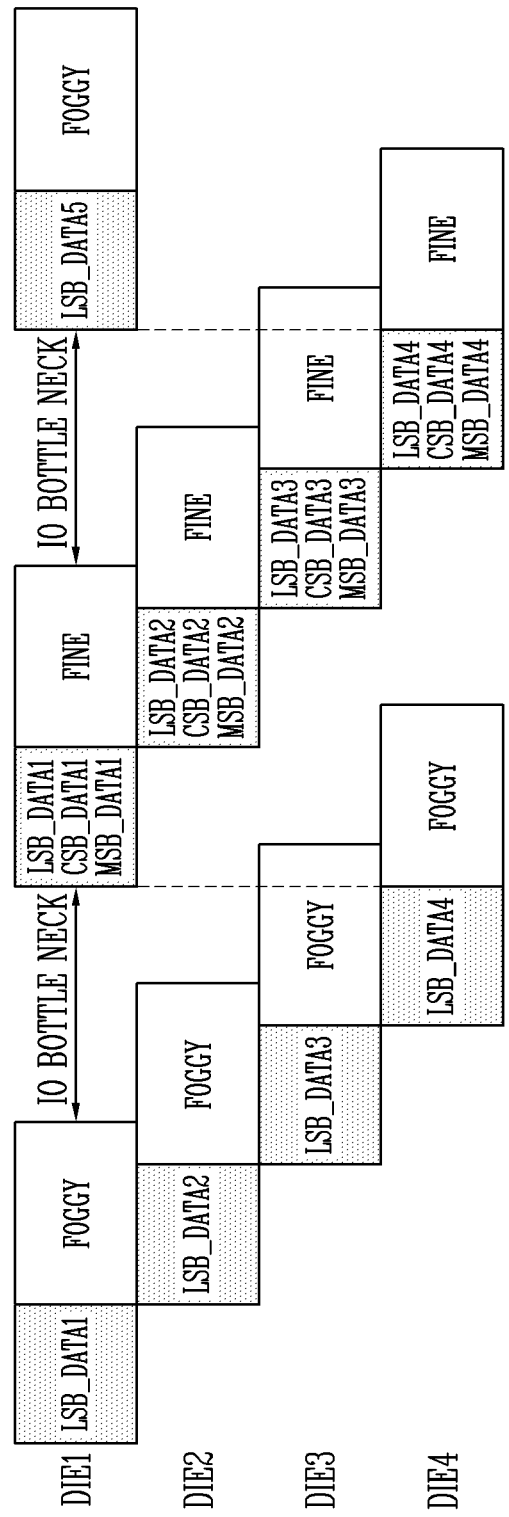

FIGS. 8A and 8B are diagrams for describing an I/O bottleneck phenomenon which may occur during the foggy-fine program operation of FIGS. 7A and 7B. In FIGS. 7A, 7B, 8A and 8B, FIG. 8A illustrates the case where the foggy-fine program operation of FIG. 7A is performed on a plurality of dies, and FIG. 8B illustrates the case where the foggy-fine program operation of FIG. 7B is performed on a plurality of dies.

Referring to FIGS. 8A and 8B, it is assumed that the memory controller (e.g., 200 of FIG. 1) and the memory device (e.g., 100 of FIG. 1) are coupled to each other through the first to fourth channels, and each channel is coupled to one die. For example, a die coupled to the first channel may be a first die DIE1, a die coupled to the second channel may be a second die DIE2, a die coupled to the third channel may be a third die DIE3, and a die coupled to the fourth channel may be a fourth die DIE4.

Referring to FIG. 8A, first LSB page data LSB_DATA1 to be programmed on the first die DIE1 may be received. The first LSB page data LSB_DATA1 may be data for which a foggy program operation FOGGY is to be performed. In an embodiment, when the first LSB page data LSB_DATA1 is foggy-programmed on the first die DIE1, second LSB page data LSB_DATA2 to be programmed to the second die DIE2 may be received. The second LSB page data LSB_DATA2 may be data for which a foggy program operation FOGGY is to be performed.

Thereafter, when the second LSB page data LSB_DATA2 is foggy-programmed on the second die DIE2, third LSB page data LSB_DATA3 to be programmed to the third die DIE3 may be received. When the third LSB page data LSB_DATA3 is foggy-programmed on the third die DIE3, fourth LSB page data LSB_DATA4 to be programmed to the fourth die DIE4 may be received. When the fourth LSB page data LSB_DATA4 is foggy-programmed on the fourth die DIE4, data to be programmed to the first die DIE1 may be received again.

After the foggy program operation FOGGY has been performed on the fourth die DIE4, a program operation to be performed on the first die DIE1 may be a fine program operation FINE. Therefore, when the fourth LSB page data LSB_DATA4 is foggy-programmed on the fourth die DIE4, first LSB page data LSB_DATA1, first CSB page data CSB_DATA1, and first MSB page data MSB_DATA1 that are to be programmed to the first die DIE1 may be received.

However, after the foggy program operation FOGGY has been performed on the first die DIE1, the foggy program operations FOGGY are successively performed on the second to fourth dies DIE2 to DIE4. Hence, a time delay may occur until new data is input after the foggy program operation FOGGY has been performed on the first die DIE1. In other words, an I/O bottleneck phenomenon may occur.

Moreover, after the fine program operation FINE has been performed on the first die DIE1, the fine program operations FINE are successively performed on the second to fourth dies DIE2 to DIE4. Hence, a time delay may occur until new data is input after the fine program operation FINE has been performed on the first die DIE1.

Referring to FIG. 8B, in the same manner as FIG. 8A, when first LSB page data LSB_DATA1 is foggy-programmed on the first die DIE1, second LSB page data LSB_DATA2 to be programmed to the second die DIE2 may be received. When the second LSB page data LSB_DATA2 is foggy-programmed on the second die DIE2, third LSB page data LSB_DATA3 to be programmed to the third die DIE3 may be received. When the third LSB page data LSB_DATA3 is foggy-programmed on the third die DIE3, fourth LSB page data LSB_DATA4 to be programmed to the fourth die DIE4 may be received. When the fourth LSB page data LSB_DATA4 is foggy-programmed on the fourth die DIE4, data to be programmed to the first die DIE1 may be received again.

After the foggy program operation FOGGY has been performed on the fourth die DIE4, a program operation to be performed on the first die DIE1 may be a fine program operation FINE.

However, unlike FIG. 8A, the fine program operation FINE is performed with a combination of data by reading LSB page data through a recovery operation REC. Hence, when the fourth LSB page data LSB_DATA4 is foggy-programmed to the fourth die DIE4, first CSB page data CSB_DATA1 and first MSB page data MSB_DATA1 that are to be programmed to the first die DIE1 may be received.

In the same manner as FIG. 8A, after the foggy program operation FOGGY has been performed on the first die DIE1, the foggy program operations FOGGY are performed on the second to fourth dies DIE2 to DIE4. Hence, a time delay may occur until new data is input after the foggy program operation FOGGY has been performed on the first die DIE1. In other words, an I/O bottleneck phenomenon may occur.

Moreover, after the fine program operation FINE has been performed on the first die DIE1, the fine program operations FINE are performed on the second to fourth dies DIE2 to DIE4. Hence, a time delay may occur until new data is input after the fine program operation FINE has been performed on the first die DIE1.

Consequently, when the foggy-fine program operation described with reference to FIGS. 8A and 8B is used, a time delay may occur between a data program operation and a data input operation, program performance may be reduced. In other words, a time delay may be caused until data is received after a foggy program operation, and a time delay may occur until data is received after a fine program operation.

Furthermore, in FIGS. 8A and 8B, as the number of channels for coupling the memory device (e.g., 100 of FIG. 1) with the memory controller (e.g., 200 of FIG. 1) is increased and the number of dies coupled to each channel is increased, performance degradation attributable to the I/O bottleneck phenomenon may be increased.

Figure 9:
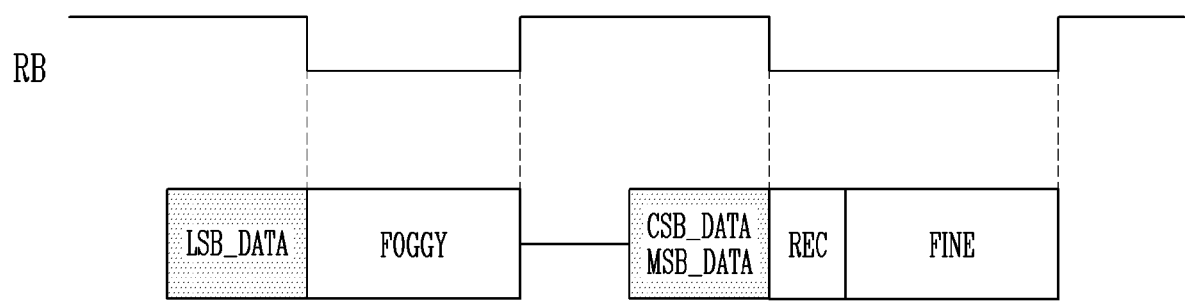
FIG. 9 illustrates a ready-busy signal.

FIG. 9 illustrates a ready-busy signal during the foggy-fine program operation of FIG. 7B, and specifically illustrates a process through which a ready/busy signal RB enters a high-level state or a low-level state during the foggy-fine program operation.

In one case, the memory device (e.g., 100 of FIG. 1) may provide a ready/busy signal RB indicating whether the memory device (e.g., 100 of FIG. 1) is in a ready state or a busy state to the memory controller (e.g., 200 of FIG. 1) through a ready/busy line.

The ready/busy signal RB may indicate the state of the memory device (e.g., 100 of FIG. 1). A ready/busy signal RB having a low-level state may indicate that the memory device is performing at least one operation. A ready/busy signal having a high-level state may indicate that the memory device is performing no operation.

In an embodiment, the memory device may receive LSB page data LSB_DATA from the memory controller. While the LSB page data LSB_DATA is received from the memory controller, the memory device is in the ready state, and a ready/busy signal RB having the high-level state may be output to the memory controller.

Thereafter, while the memory device performs a foggy program operation FOGGY for the LSB page data LSB_DATA, the memory device is in the busy state, and a ready/busy signal RB having the low-level state may be output to the memory controller.

In one case, if the memory device completes the foggy program operation FOGGY for the LSB page data LSB_DATA, the memory device may receive CSB page data CSB_DATA and MSB page data MSB_DATA from the memory controller. While the CSB page data CSB_DATA and the MSB page data MSB_DATA are received from the memory controller, the memory device is in the ready state, and a ready/busy signal RB having the high-level state may be output to the memory controller.

Subsequently, the memory device may perform a recovery operation REC for reading the programmed LSB page data LSB_DATA, and may perform a fine program operation FINE with a combination of the read data and the received data. While the memory device performs the recovery operation REC and the fine program operation FINE, the memory device is in the busy state and a ready/busy signal RB having the low-level state may be output to the memory controller.

In one case, if the memory device completes the fine program operation FINE, a ready/busy signal RB having the high-level state may be output to the memory controller.

Consequently, when the fine program operation FINE is performed with the received CSB page data CSB_DATA and MSB page data MSB_DATA, after the foggy program operation FOGGY is performed with the received LSB page data LSB_DATA, the data may be programmed through two busy periods. In the case where the data is programmed through the two busy periods, a time delay between the foggy program operation FOGGY and a data input operation may occur, and a time delay between the fine program operation FINE and a data input operation may occur.

In accordance with one or more embodiments, a method is provided for programming data through one busy period.

Figure 10:
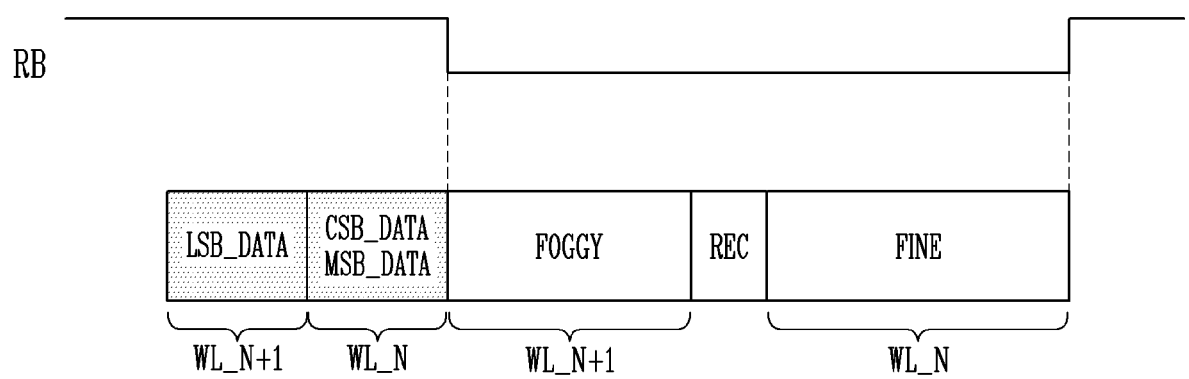
FIG. 10 illustrates embodiments of a ready/busy signal and program method for reducing an I/O bottleneck phenomenon.

FIG. 10 illustrates embodiments of a ready/busy signal and a program method for reducing or minimizing the I/O bottleneck phenomenon of FIGS. 5 and 8. In particular, these embodiments correspond to a process through which a ready/busy signal RB enters a high-level state or a low-level state during a foggy-fine program operation.

In FIG. 10, it is assumed that the memory device (e.g., 100 of FIG. 1) performs a program operation for memory cells coupled to an N-th word line WL_N. For example, the N-th word line WL_N may be a target word line on which the program operation is performed. Also, it is assumed that a word line adjacent to the N-th word line WL_N that is the target word line is an N+1-th word line WL_N+1.

Referring to FIG. 10, in an embodiment, the memory device may receive LSB page data LSB_DATA from the memory controller (e.g., 200 of FIG. 1). While the LSB page data LSB_DATA is received from the memory controller, the memory device is in the ready state because the program operation, the read operation or the erase operation is not performed, and a ready/busy signal RB having the high-level state may be output to the memory controller. Here, the received LSB page data LSB_DATA may be programmed to the memory cells of the N+1-th word line WL_N+1 adjacent to the N-th word line WL_N.

Unlike the foggy-fine program of FIGS. 8A and 8B, the memory device in the present embodiment may receive the LSB page data LSB_DATA from the memory controller and then successively receive CSB page data CSB_DATA and MSB page data MSB_DATA. While the CSB page data CSB_DATA and the MSB page data MSB_DATA are received from the memory controller, the memory device is in the ready state, and a ready/busy signal RB having the high-level state may be output to the memory controller.

Thereafter, the memory device may program the LSB page data LSB_DATA to the memory cells of the N+1-th word line WL_N+1 that is a word line adjacent to the target word line. Here, a program operation that is performed may be a foggy program operation FOGGY. While the memory device performs the foggy program operation FOGGY, the memory device may be in the busy state, and a ready/busy signal RB having the low-level state may be output to the memory controller.

If the foggy program operation FOGGY for the LSB page data LSB_DATA is completed, the memory device may read the N+1-th word line WL_N+1 and perform a recovery operation REC for obtaining the LSB page data LSB_DATA. While the memory device performs the recovery operation REC, the memory device is in the busy state, and a ready/busy signal RB having the low-level state may be output to the memory controller.

In an embodiment, if the LSB page data LSB_DATA is obtained through the recovery operation REC, the memory device may combine read data with the CSB page data CSB_DATA and the MSB page data MSB_DATA, and then program the combined data to the memory cells of the N-th word line WL_N that is the target word line. Here, a program operation that is performed may be a fine program operation FINE. While the memory device performs the fine program operation FINE, the memory device is in the busy state, and a ready/busy signal RB having the low-level state may be output to the memory controller.

In an embodiment, if the memory device completes the fine program operation FINE, a ready/busy signal RB having the high-level state may be output to the memory controller.

As a result, when the fine program operation FINE is performed in a scheme of successively receiving the LSB page data LSB_DATA, the CSB page data CSB_DATA, and the MSB page data MSB_DATA, the data may be combined and programmed in one busy period. In other words, when the ready/busy signal RB is changed from the high-level state to the low-level state, the memory device may start a foggy-fine program operation. When the ready/busy signal RB is changed from the low-level state to the high-level state again, the memory device may terminate the foggy-fine program operation.

Therefore, different from the case of FIG. 9, in the present embodiment data may be programmed through one busy period because there is no need to receive the CSB page data CSB_DATA and the MSB page data MSB_DATA after the foggy program operation FOGGY has been completed. Since data is programmed in the one busy period, the occurrence of an I/O bottleneck phenomenon may be prevented or its effects reduced. Furthermore, since a program operation is first performed on the memory cells of the N+1-th word line WL_N+1 (that is a word line adjacent to the target word line), the occurrence of an interference phenomenon may be prevented or its effects reduced.

Figure 11:
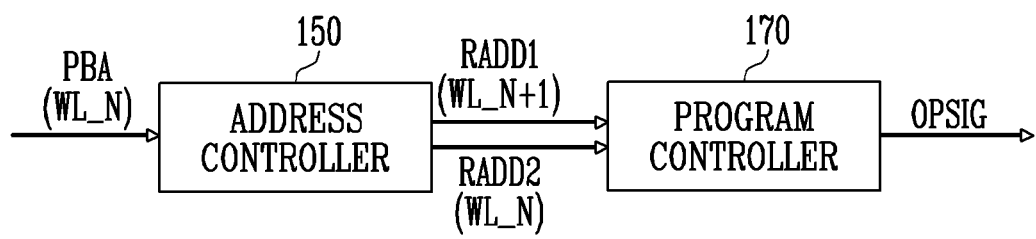
FIG. 11 illustrates an embodiment of a memory device performing a program operation.

FIG. 11 illustrates an embodiment of a memory device for a program operation. In FIG. 11, the embodiment may be included in the memory device (e.g., 100 of FIG. 1) to perform the program operation of FIG. 10. For example, for the program operation of FIG. 10, the memory device may include an address controller 150 and a program controller 170. In an embodiment, the address controller 150 and the program controller 170 may be included in the control logic (e.g., 130 of FIG. 2) or disposed outside the control logic.

In the same manner as in FIG. 10, it may be assumed that a program operation to be performed in FIG. 11 is a foggy-fine program operation according to embodiments described herein, a target word line on which the foggy-fine program operation is to be performed is the N-th word line WL_N, and a word line adjacent to the target word line is the N+1-th word line WL_N+1.

Referring to FIG. 11, when the memory device receives a command corresponding to the foggy-fine program operation from the memory controller, the address controller 150 may receive a physical block address PBA from the memory controller. The physical block address PBA received from the memory controller may be an address corresponding to the N-th word line WL_N that is the target word line on which the foggy-fine program operation is to be performed.

In the present embodiment, since the LSB page data LSB_DATA is programmed to the memory cells of the N+1-th word line WL_N+1 adjacent to the N-th word line WL_N, the address controller 150 may receive an address corresponding to the N-th word line WL_N and generate a new address. For example, if the memory device receives an address corresponding to the N-th word line WL_N that is the target word line, a new physical block address may be generated by combining physical block addresses respectively corresponding to the target word line and the word line adjacent to the target word line.

When it is assumed that the word line adjacent to the target word line is the N+1-th word line WL_N+1, address controller 150 may generate a new address by combining an address corresponding to the N+1-th word line WL_N+1 with an address corresponding to the N-th word line WL_N. In an embodiment, the address corresponding to the N+1-th word line WL_N+1 may be a first row address RADD1, and the address corresponding to the N-th word line WL_N may be a second row address RADD2.

Therefore, after having generated the new address, the address controller 150 may output the first row address RADD1 to the program controller 170 to first program the LSB page data LSB_DATA to the memory cells of the N+1-th word line WL_N+1. In response to the first row address RADD1, the program controller 170 may output an operating signal OPSIG for instructing to perform a foggy program operation FOGGY on the memory cells of the N+1-th word line WL_N+1 corresponding to the first row address RADD1. Here, data to be programmed by the foggy program operation FOGGY may be the LSB page data LSB_DATA.

Thereafter, the address controller 150 may output the second row address RADD2 to the program controller 170, so as to program LSB page data LSB_DATA, CSB page data CSB_DATA, and MSB page data MSB_DATA to the N-th word line WL_N. In response to the second row address RADD2, the program controller 170 may output an operating signal OPSIG for instructing to perform a fine program operation FINE on the memory cells of the N-th word line WL_N corresponding to the second row address RADD2. Here, data to be programmed by the fine program operation FINE may be the LSB page data LSB_DATA, the CSB page data CSB_DATA, and the MSB page data MSB_DATA.

As a result, by the above-mentioned program operation, an interference phenomenon may be prevented from occurring (or its effects may be reduced) on the memory cells of the N+1-th word line WL_N+1 (that is a word line adjacent to the N-th word line WL_N) on which the program operation is to be performed. Also, an I/O bottleneck phenomenon may be prevented from occurring (or its effects reduced) when the memory device performs a program operation on a plurality of dies.

Figure 12:
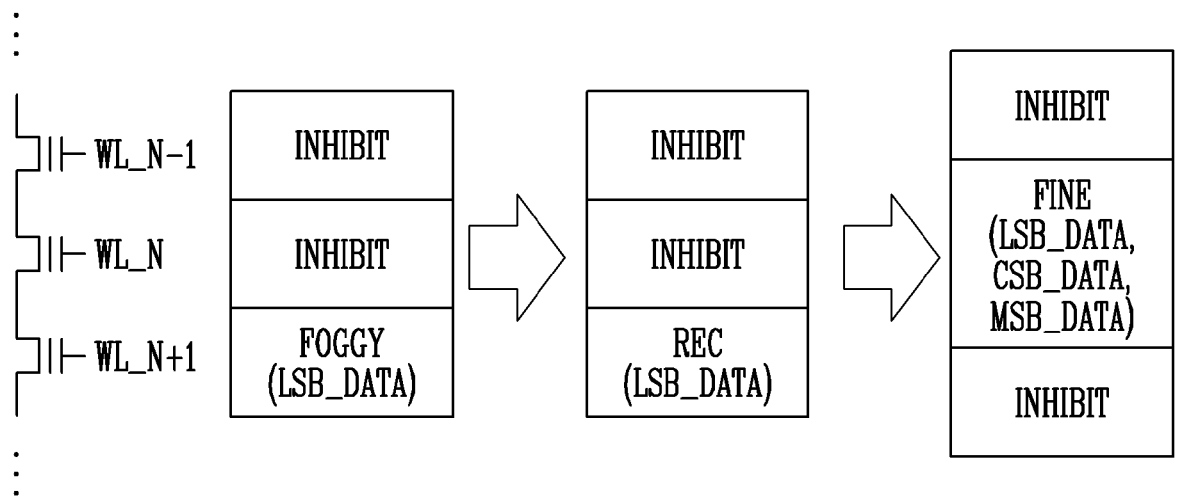
FIG. 12 illustrates an embodiment of a process through which a target word line is programmed.

FIG. 12 illustrates an embodiment of a process through which a target word line is programmed. FIG. 12 illustrates an N-th word line WL_N that is a target word line on which a foggy-fine program operation is to be performed, an N+1-th word line WL_N+1 and an N-1-th word line WL_N-1 that are adjacent to the N-th word line WL_N, and a process of performing the foggy-fine program operation.

In an embodiment, the foggy-fine program operation may be performed on the memory cells coupled to the N-th word line WL_N, e.g., the N-th word line WL_N may be a target word line.

Referring to FIG. 12, when the memory device (e.g., 100 of FIG. 1) performs the foggy-fine program operation, the memory device may successively receive LSB page data LSB_DATA, CSB page data CSB_DATA, and MSB page data MSB_DATA, and a foggy program operation FOGGY may then be performed. The foggy program operation FOGGY may include an operation of programming the LSB page data LSB_DATA to the memory cells of the N+1-th word line WL_N+1 that is a word line adjacent to the target word line.

In an embodiment, when the memory device programs the LSB page data LSB_DATA to the memory cells of the N+1-th word line WL_N+1, an operation on the memory cells of the N-1-th word line WL_N-1 and the N-th word line WL_N (that is the target word line) may be inhibited (e.g., as illustrated by reference INHIBIT).

Thereafter, if the foggy program operation FOGGY on the memory cells of the N+1-th word line WL_N+1 is completed, the memory device may read the N+1-th word line WL_N+1 and perform a recovery operation REC to obtain the LSB page data LSB_DATA. While the memory device performs the recovery operation REC, an operation on the memory cells of the N-1-th word line WL_N-1 and the N-th word line WL_N that is the target word line may be inhibited (e.g., as illustrated by reference INHIBIT).

If the LSB page data LSB_DATA is obtained through the recovery operation REC, the memory device may combine read data with the CSB page data CSB_DATA and the MSB page data MSB_DATA, and then the combined data may be programmed to the memory cells of the N-th word line WL_N that is the target word line. Here, a program operation that is performed may be a fine program operation FINE. While the memory device (e.g., 100 of FIG. 1) performs the fine operation FINE, an operation on the memory cells of the N+1-th word line WL_N+1 and the N-1-th word line WL_N-1 may be inhibited (as illustrated by reference INHIBIT).

Figure 13:
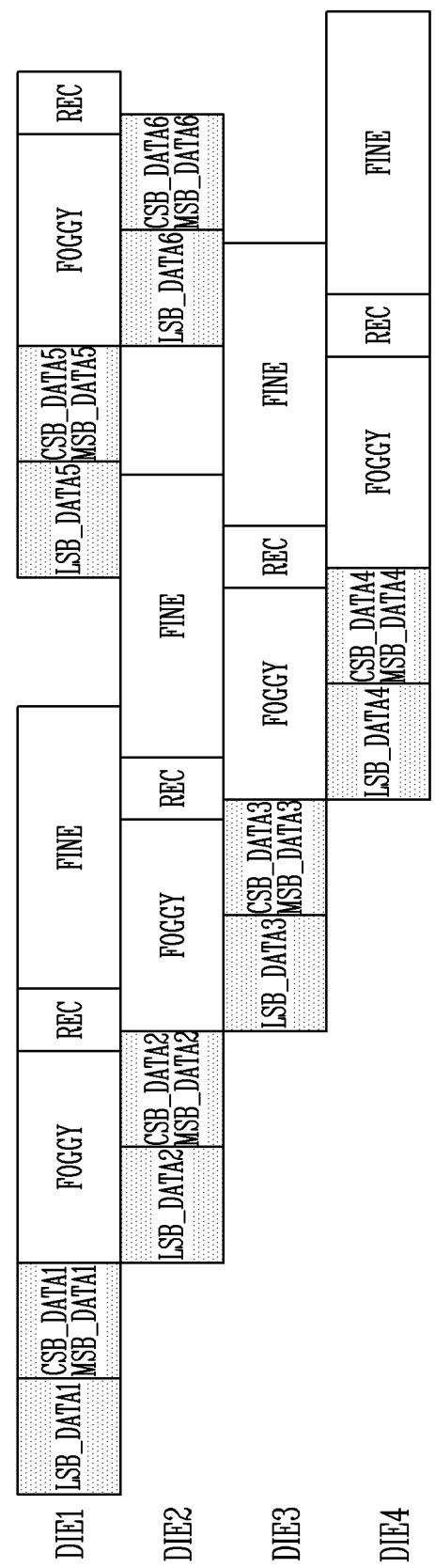
FIG. 13 illustrates an example of an I/O bottleneck phenomenon.

FIG. 13 is a diagram for describing an I/O bottleneck phenomenon which may occur during the program of FIG. 10. In FIG. 13, the case is illustrated where the foggy-fine program operation of FIG. 10 is performed on a plurality of dies.

In FIG. 10, it is assumed that the memory controller (e.g., 200 of FIG. 1) and the memory device (e.g., 100 of FIG. 1) are coupled to each other through the first to fourth channels, and one die is coupled to each channel. For example, a die coupled to the first channel may be a first die DIE1, a die coupled to the second channel may be a second die DIE2, a die coupled to the third channel may be a third die DIE3, and a die coupled to the fourth channel may be a fourth die DIE4.

Referring to FIG. 13, first LSB page data LSB_DATA1, first CSB page data CSB_DATA1, and first MSB page data MSB_DATA1 that are to be programmed to the first die DIE1 may be successively received. The first LSB page data LSB_DATA1 may be data for which a foggy program operation FOGGY is to be performed. The first LSB page data LSB_DATA1, the first CSB page data CSB_DATA1, and the first MSB page data MSB_DATA1 may be data for which a fine program operation FINE is to be performed.

In an embodiment, when the first LSB page data LSB_DATA1 is foggy-programmed on the first die DIE1 after the first LSB page data LSB_DATA1, the first CSB page data CSB_DATA1, and the first MSB page data MSB_DATA1 have been successively received, second LSB page data LSB_DATA2, second CSB page data CSB_DATA2, and second MSB page data MSB_DATA2 that are to be programmed to the second die DIE2 may be successively received. The second LSB page data LSB_DATA2 may be data for which a foggy program operation FOGGY is to be performed. The second LSB page data LSB_DATA2, the second CSB page data CSB_DATA2, and the second MSB page data MSB_DATA2 may be data for which a fine program operation FINE is to be performed.

As described above, when the second LSB page data LSB_DATA2 is foggy-programmed on the second die DIE2, third LSB page data LSB_DATA3, third CSB page data CSB_DATA3, and third MSB page data MSB_DATA3 that are to be programmed to the third die DIE3 may be successively received. Furthermore, when the third LSB page data LSB_DATA3 is foggy-programmed to the third die DIE3, fourth LSB page data LSB_DATA4, fourth CSB page data CSB_DATA4, and fourth MSB page data MSB_DATA4 that are to be programmed to the fourth die DIE4 may be successively received.

When the fourth LSB page data LSB_DATA4 is foggy-programmed on the fourth die DIE4, fifth LSB page data LSB_DATA5, fifth CSB page data CSB_DATA5, and fifth MSB page data MSB_DATA5 that are to be programmed to the first die DIE1 may be successively received.

However, unlike FIGS. 8A and 8B, in the case of FIG. 13, the time it takes to receive data to be programmed again after the fine program operation FINE has been completed in each die may be reduced. This is because the foggy program operation FOGGY, the recovery operation REC, and the fine program operation FINE are successively performed after LSB page data, CSB page data, and MSB page data are successively received. In other words, since the foggy program operation FOGGY, the recovery operation REC, and the fine program operation FINE are performed through one busy period, an I/O bottleneck phenomenon may be prevented or mitigated.

In addition, since the recovery operation is performed on an adjacent word line rather than being performed on the target word line, degradation attributable to successive data program operations may be prevented or reduced. Furthermore, since a program operation is first performed on the memory cells of the word line adjacent to the target word line, an interference phenomenon may be prevented or reduced.

Figure 14:
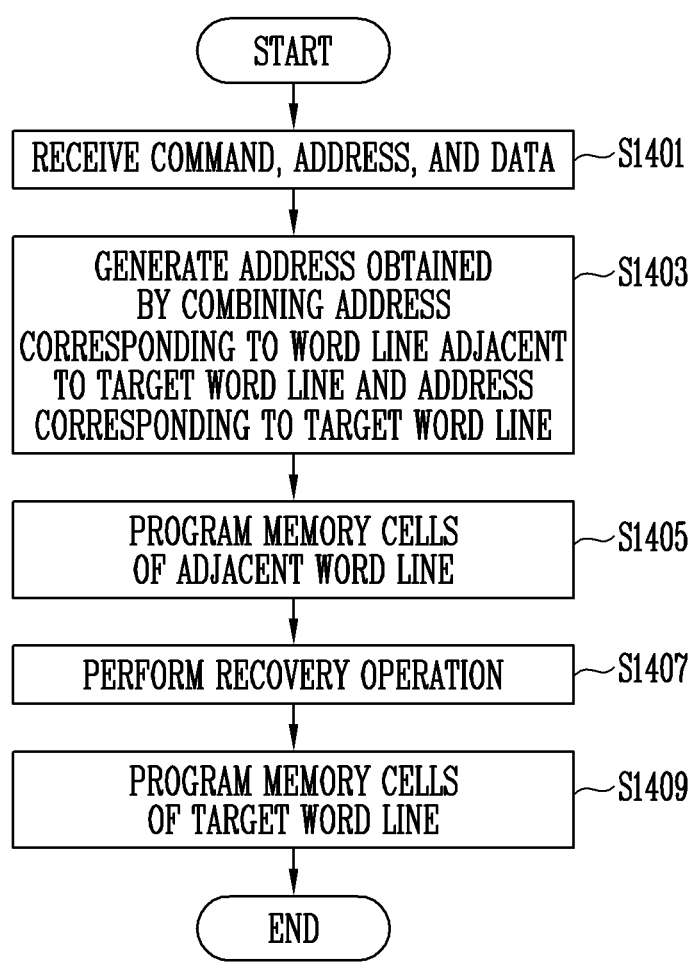
FIG. 14 illustrates an embodiment of a method of operating a memory device.

FIG. 14 is a diagram describing an embodiment of a method which may be performed by a memory device, which, for example, may be any of the embodiments of the memory device described herein. Also, the memory controller discussed below may correspond to any of the disclosed embodiments.

Referring to FIG. 14, at operation S1401, the memory device may receive a command, an address, and data from the memory controller. The command may be a command corresponding to a foggy-fine program operation. The address may be a physical block address corresponding to a target word line on which the foggy-fine program operation is to be performed. The data may be data for which the foggy-fine program operation is to be performed.

At operation S1403, the memory device may generate an address by combining an address corresponding to a word line adjacent to the target word line and an address corresponding to the target word line. For example, in the case where the target word line is an N-th word line WL_N, the memory device may generate an address by combining an address corresponding to an N+1-th word line WL_N+1 adjacent to the N-th word line WL_N and an address corresponding to the N-th word line WL_N.

At operation S1405, the memory device may program the memory cells of the word line adjacent to the target word line. Here, a program operation that is performed may be a foggy program operation FOGGY and data that is programmed may be LSB page data. For example, as an address corresponding to the word line adjacent to the target word line (among addresses included in newly generated addresses) is output, LSB page data may be foggy-programmed on the memory cells of the adjacent word line.

At operation S1407, the memory device may perform a recovery operation. The recovery operation may be, for example, an operation of reading data programmed to the memory cells of the word line adjacent to the target word line.

In the present embodiment, since the LSB page data, the CSB page data, and the MSB page data are successively received and the LSB page data is not received again, data for which the foggy-fine program operation is to be performed may be generated by reading the LSB page data programmed to the memory cells of the word line adjacent to the target word line. The read data may be combined with the CSB page data and the MSB page data.

At operation S1409, the memory device may program the memory cells of the target word line. Here, a program operation that is performed may be a fine program operation FINE and data to be programmed may be data generated by combining the LSB page data, the CSB page data, and the MSB page data. For example, as an address corresponding to the target word line (among addresses included in a newly generated address) is output, the data generated by combining the LSB page data, the CSB page data, and the MSB page data may be fine-programmed to the memory cells of the target word line.

Figure 15:
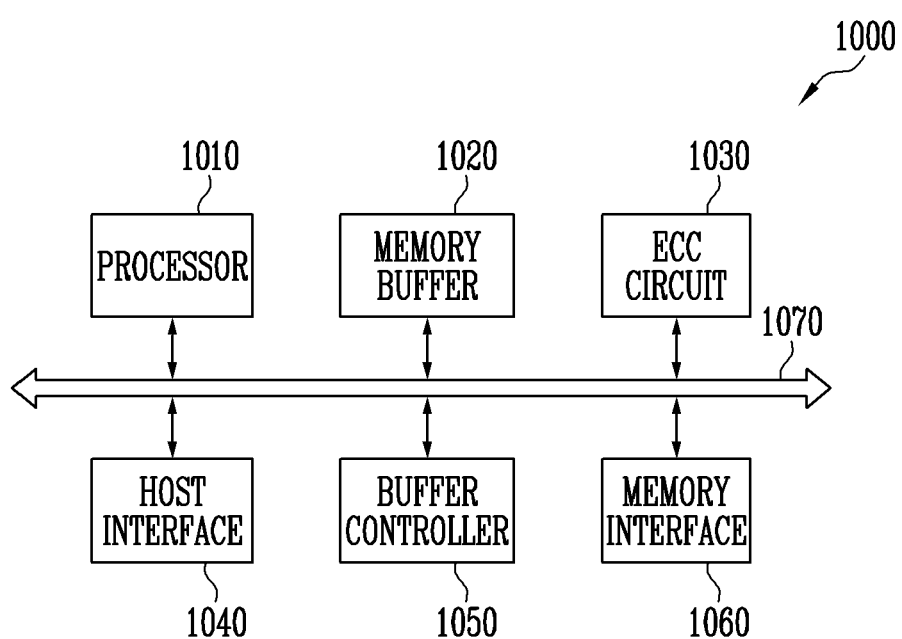
FIG. 15 illustrates an embodiment of a memory controller.

FIG. 15 is a diagram illustrating an embodiment of the memory controller 1000 of FIG. 1, which may be coupled to a host and a memory device. In operation, the memory controller 1000 may access the memory device in response to a request from the host. For example, the memory controller 1000 may control a write operation, a read operation, an erase operation, and/or a background operation of the memory device. The memory controller 1000 may serve as an interface between the memory device and the host and may drive instructions (e.g., firmware) for controlling the memory device.

Referring to FIG. 15, the memory controller 1000 may include a processor 1010, a memory buffer 1020, an error correction code (ECC) circuit 1030, a host Interface 1040, a buffer controller 1050, a memory interface 1060, and a bus 1070. The bus 1070 may provide a channel between the components of the memory controller 1000.

The processor 1010 may control the overall operation of the memory controller 1000 and perform a logical operation. The processor 1010 may communicate with the external host through the host interface 1040 and may communicate with the memory device through the memory interface 1060. In addition, the processor 1010 may communicate with the memory buffer 1020 through the buffer controller 1050. The processor 1010 may control the operation of the storage device by using the memory buffer 1020 as an operating memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host.

The randomized data may be provided to the memory device as data to be stored and may be programmed to the memory cell array. The processor 1010 may drive instructions (e.g., software, firmware, etc.) to perform the randomizing operation or the derandomizing operation.

The memory buffer 1020 may be used as a working memory, a cache memory, or a buffer memory of the processor 1010. The memory buffer 1020 may store codes and commands to be executed by the processor 1010 and may store data to be processed by the processor 1010. The memory buffer 1020 may include, for example, a static RAM (SRAM) or a dynamic RAM (DRAM).

The ECC circuit 1030 may perform error correction. For example, the ECC circuit 1030 may perform an ECC encoding operation based on data to be written to the memory device through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be in the memory interface 1060 as a component of the memory interface 1060.

The host interface 1040 may communicate with the external host under control of the processor 1010. The host interface 1040 may perform communication using at least one of various communication methods. Examples include a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multi-media card (MMC), an embedded MMC (eMMC), a dual in-line memory module (DIMM), a registered DIMM (RDIMM), and a load reduced DIMM (LRDIMM) communication methods.

The buffer controller 1050 may control the memory buffer 1020 under control of the processor 1010. The memory interface 1060 may communicate with the memory device under control of the processor 1010 and may communicate a command, an address, and data with the memory device through the channel.

In one embodiment, the memory controller 1000 may include neither the memory buffer 1020 nor the buffer controller 1050. For example, the processor 1010 may control the operation of the memory controller 1000 using codes. The processor 1010 may load codes from a nonvolatile memory device (e.g., a read only memory) provided in the memory controller 1000. In one embodiment, the processor 1010 may load codes from the memory device through the memory interface 1060.

The bus 1070 of the memory controller 1000 may be divided, for example, into a control bus and a data bus. The data bus may transmit data in the memory controller 1000. The control bus may transmit control information such as a command and an address in the memory controller 1000. The data bus and the control bus may be separated from each other and may not interfere with each other. The data bus may be coupled to the host interface 1040, the buffer controller 1050, the ECC circuit 1030, and the memory interface 1060. The control bus may be coupled to the host interface 1040, the processor 1010, the buffer controller 1050, the memory buffer 1020, and the memory interface 1060.

Figure 16:
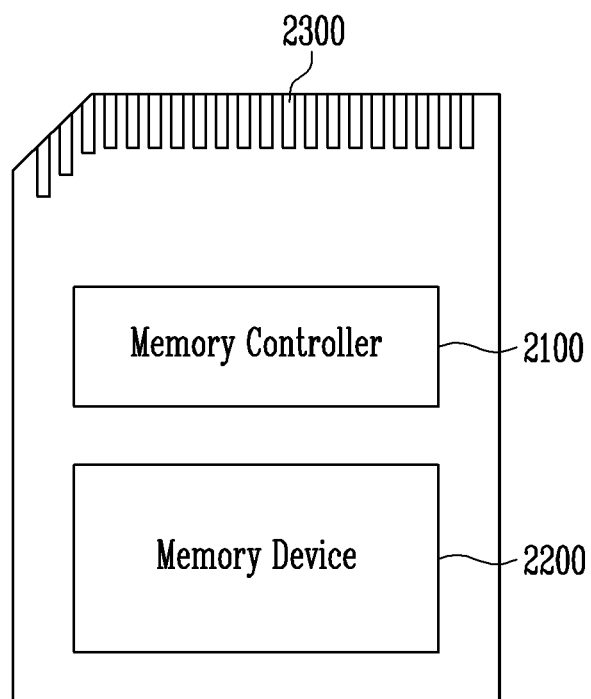
FIG. 16 illustrates an embodiment of a memory card system.

FIG. 16 is a block diagram illustrating an embodiment of a memory card system 2000 including the storage device as described.

Referring FIG. 16, the memory card system 2000 may include a memory controller 2100, a memory device 2200, and a connector 2300. The memory controller 2100 is coupled to the memory device 2200 and may access the memory device 2200. For example, the memory controller 2100 may control a read operation, a write operation, an erase operation, and a background operation of the memory device 2200. The memory controller 2100 may serve as an interface between the memory device 2200 and the host. The memory controller 2100 may drive instructions (e.g., firmware) for controlling the memory device 2200. The memory device 2200 may be embodied in the same manner as that of the memory device (e.g., 100 of FIG. 1) described with reference to FIG. 1.

In an embodiment, the memory controller 2100 may include components such as a random access memory (RAM), a processing unit, a host interface, and a memory interface, and an ECC circuit.

The memory controller 2100 may communicate with an external device through the connector 2300 and may communicate with an external device (e.g., a host) based on a specific communication protocol. In an embodiment, the memory controller 2100 may communicate with the external device through at least one of various communication protocols. Examples include a universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices. Examples include an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

In an embodiment, the memory controller 2100 and the memory device 2200 may be integrated into a single semiconductor device to form a memory card. Examples include a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

In an embodiment, the memory device 2200 may perform a foggy-fine program operation. The foggy-fine program operation may be an operation of programming LSB page data to memory cells having the erased state E and then programming the memory cells to a target programmed state through a foggy program operation and a fine program operation.

When the memory device 2200 performs the foggy-fine program operation, LSB page data, CSB page data, and MSB page data may be successively received. Thereafter, the memory device 2200 may foggy-program the LSB page data to a word line adjacent to a target word line.

In an embodiment, if the LSB page data is programmed to memory cells of the word line adjacent to the target word line, the memory device 2200 may perform a recovery operation of reading the LSB page data programmed to the memory cells of the adjacent word line. If the LSB page data is read by the recovery operation, the memory device 2200 may generate new data obtained by combining the LSB page data, the CSB page data, and the MSB page data.

If the new data is generated, the memory device 2200 may fine-program the combined new data to the target word line.

During the foggy-fine program described above, the LSB page data, the CSB page data, and the MSB page data are successively received. The foggy program operation FOGGY is then first performed on the memory cells of the adjacent word line, and then the fine program operation FINE is performed on the memory cells of the target word line. Therefore, the time it takes to receive data to be programmed after the fine program operation is completed in each die may be reduced. For example, since the foggy program operation FOGGY, the recovery operation, and the fine program operation FINE are performed through one busy period, an I/O bottleneck phenomenon may be prevented or mitigated.

In addition, since the recovery operation is performed on an adjacent word line rather than being performed on the target word line, degradation attributable to successive data program operations may be prevented or reduced. Furthermore, since a program operation is first performed on the memory cells of the word line adjacent to the target word line, an interference phenomenon may be prevented or reduced.

Figure 17:
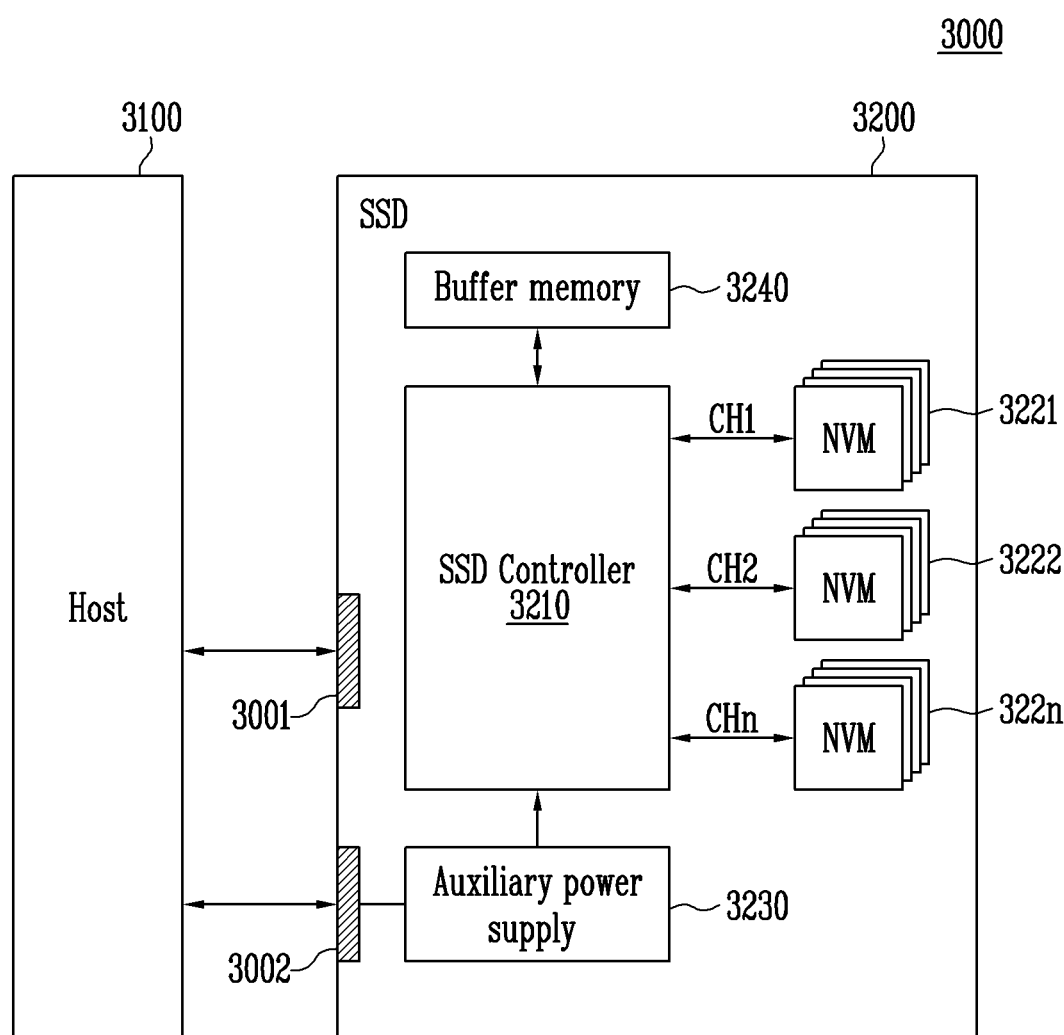
FIG. 17 illustrates an embodiment of a solid state drive (SSD) system.

FIG. 17 is a block diagram illustrating an embodiment of a solid state drive (SSD) system 3000 to which the storage device as described herein may be applied.

Referring to FIG. 17, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322$n$, an auxiliary power supply 3230, and a buffer memory 3240.

In an embodiment, the SSD controller 3210 may perform the function of the memory controller (e.g., 200 of FIG. 1), described above with reference to FIG. 1. The SSD controller 3210 may control the plurality of flash memories 3221 to 322$n$ in response to the signals SIG received from the host 3100. In an embodiment, the signals SIG may be signals based on an interface between the host 3100 and the SSD 3200. For example, the signals SIG may be signals compatible by at least one of various interfaces. Examples include a universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged by the power PWR. The auxiliary power supply 3230 may supply the power of the SSD 3200 when the supply of power from the host 3100 is not smoothly performed (e.g., deviates from a predetermined level or pattern). In an embodiment, the auxiliary power supply 3230 may be positioned inside the SSD 3200 or outside the SSD 3200. For example, the auxiliary power supply 3230 may be in a main board to supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322$n$, or may temporarily store metadata (e.g., a mapping table) of the flash memories 3221 to 322$n$. The buffer memory 3240 may a volatile memory. Examples include DRAM, SDRAM, DDR SDRAM, LPDDR SDRAM, and GRAM or nonvolatile memories such as FRAM, ReRAM, STT-MRAM, and PRAM.

In an embodiment, each of the plurality of flash memories 3221 to 322$n$ may perform a foggy-fine program operation. The foggy-fine program operation may include an operation of programming LSB page data to memory cells having the erased state E and then programming the memory cells to a target programmed state through a foggy program operation and a fine program operation.

When each of the plurality of flash memories 3221 to 322$n$ performs the foggy-fine program operation, LSB page data, CSB page data, and MSB page data may be successively received. Thereafter, each of the plurality of flash memories 3221 to 322$n$ may foggy-program the LSB page data to a word line adjacent to a target word line.

In an embodiment, if the LSB page data is programmed to memory cells of the word line adjacent to the target word line, each of the plurality of flash memories 3221 to 322$n$ may perform a recovery operation of reading the LSB page data programmed to the memory cells of the adjacent word line. If the LSB page data is read by the recovery operation, each of the plurality of flash memories 3221 to 322$n$ may generate new data obtained by combining the LSB page data, the CSB page data, and the MSB page data. If the new data is generated, each of the plurality of flash memories 3221 to 322$n$ may fine-program the combined new data to the target word line.

During the foggy-fine program described above, the LSB page data, the CSB page data, and the MSB page data may be successively received, and the foggy program operation FOGGY may be first performed on the memory cells of the adjacent word line. Then, the fine program operation FINE may be performed on the memory cells of the target word line. Therefore, the time it takes to receive data to be programmed, after the fine program operation is completed in each die, may be reduced. For example, since the foggy program operation FOGGY, the recovery operation, and the fine program operation FINE are performed through one busy period, an I/O bottleneck phenomenon may be prevented or mitigated.

In addition, since the recovery operation is performed on an adjacent word line rather than being performed on the target word line, degradation attributable to successive data program operations may be prevented or reduced. Furthermore, since a program operation is first performed on the memory cells of the word line adjacent to the target word line, an interference phenomenon may be prevented or reduced.

Figure 18:
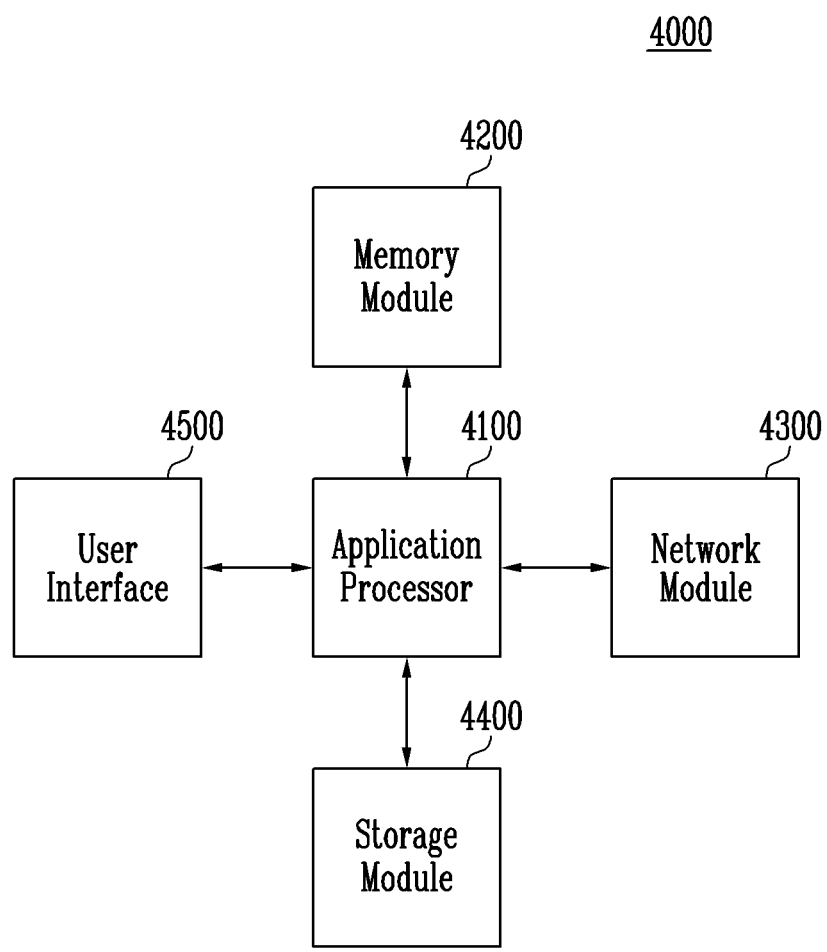
FIG. 18 illustrates an embodiment of a user system.

FIG. 18 is a block diagram illustrating an embodiment of a user system 4000 to which the storage device described herein may be applied.

Referring to FIG. 18, the user system 4000 may include an application processor 4100, a memory module 4200, a network module 4300, a storage module 4400, and a user interface 4500. The application processor 4100 may run components in the user system 4000, an operating system (OS), and/or a user program. In an embodiment, the application processor 4100 may include one or more of controllers, interfaces, graphic engines, etc., for controlling the components in the user system 4000. The application processor 4100 may be provided as a system-on-chip (SoC).

The memory module 4200 may function as a main memory, a working memory, a buffer memory, or a cache memory of the user system 4000. Examples include a volatile RAM such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or WI-FI communication. In an embodiment, the network module 4300 may be included in the application processor 4100.

The storage module 4400 may store data therein. For example, the storage module 4400 may store data received from the application processor 4100. In one embodiment, the storage module 4400 may transmit the data stored in the storage module 4400 to the application processor 4100. In an embodiment, the storage module 4400 may be implemented as a nonvolatile semiconductor memory device. Examples include a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (e.g., removable drive), such as a memory card or an external drive of the user system 4000.

In an embodiment, the storage module 4400 may include a plurality of nonvolatile memory devices, and each of which may be operated in the same manner as that of the memory device 100 described above with reference to FIGS. 2 and 3. The storage module 4400 may be operated in the same manner as that of the storage device 50 described above with reference to FIG. 1.

The user interface 4500 may include interfaces for inputting data or instructions to the application processor 4100 or outputting data to an external device. Examples of the user interface 4500 include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces. Examples include a liquid crystal display (LCD), an organic light emitting Diode (OLED) display device, an active matrix OLED (AMOLED) display device, an LED, a speaker, a monitor, and so on.

In an embodiment, the storage module 4400 may perform a foggy-fine program operation. The foggy-fine program operation may include an operation of programming LSB page data to memory cells having the erased state E and then programming the memory cells to a target programmed state through a foggy program operation and a fine program operation.

When the storage module 4400 performs the foggy-fine program operation, LSB page data, CSB page data, and MSB page data may be successively received. Thereafter, the storage module 4400 may foggy-program the LSB page data to a word line adjacent to a target word line.

In an embodiment, if the LSB page data is programmed to memory cells of the word line adjacent to the target word line, the storage module 4400 may perform a recovery operation of reading the LSB page data programmed to the memory cells of the adjacent word line. If the LSB page data is read by the recovery operation, the storage module 4400 may generate new data obtained by combining the LSB page data, the CSB page data, and the MSB page data.

If the new data is generated, the storage module 4400 may fine-program the combined new data to the target word line.

During the foggy-fine program described above, the LSB page data, the CSB page data, and the MSB page data are successively received, and the foggy program operation FOGGY may be first performed on the memory cells of the adjacent word line. Then, the fine program operation FINE may be performed on the memory cells of the target word line. Therefore, the time it takes to receive data to be programmed after the fine program operation is completed in each die may be reduced. For example, since the foggy program operation FOGGY, the recovery operation, and the fine program operation FINE are performed through one busy period, an I/O bottleneck phenomenon may be prevented or mitigated.

In addition, since the recovery operation is performed on an adjacent word line (rather than being performed on the target word line), degradation attributable to successive data program operations may be prevented or reduced. Furthermore, since a program operation is first performed on the memory cells of the word line adjacent to the target word line, an interference phenomenon may be prevented or reduced.

In accordance with one or more embodiments, an address received from a memory controller may be newly mapped and a program operation may be performed with the newly mapped address. As a result, degradation may be prevented or reduced when the memory device performs a program operation for sequential data. As used herein, the terms high-level state and low-level state may respectively correspond to a first state and a second state. In another embodiment, the first state and the second state may respectively correspond to low-level state and a high-level state.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, handlers, units, multiplexers, modules, generators, managers, logic, interfaces, decoders, drivers, generators, modules, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims. The embodiments may be combined to form additional embodiments.

What is claimed is:

1. A memory device comprising:
a plurality of memory cells configured to form a plurality of pages;
a peripheral circuit configured to perform a first program operation on a page adjacent to a selected page among the plurality of pages, and perform a second program operation on the selected page; and
control logic configured to control the peripheral circuit:
during the first program operation, to receive least significant bit (LSB) page data, center significant bit (CSB) page data, and most significant bit (MSB) page data from a memory controller, and program the LSB page data to the page adjacent to the selected page; and
during the second program operation, to program the CSB page data and the MSB page data to the selected page.

2. The memory device according to claim 1, wherein
the peripheral circuit is configured to start the first program operation and the second program operation when a ready/busy signal is changed from a first-level state to a second-level state, and
the peripheral circuit is configured to end the first program operation and the second program operation when the ready/busy signal is changed back from the second-level state to the first-level state.

3. The memory device according to claim 1, wherein the control logic is configured to generate a new address obtained by combining a target address corresponding to a selected address and an address adjacent to the target address.

4. The memory device according to claim 1, wherein the control logic is configured to control the peripheral circuit to perform, after the first program operation is performed, a recovery operation of reading the selected page.

5. The memory device according to claim 4, wherein the control logic is configured to generate new data obtained by combining data read by the recovery operation, the CSB page data, and the MSB page data.

6. The memory device according to claim 5, wherein the control logic is configured to control the peripheral circuit to program the new data to the selected page.

7. A memory device comprising:
a plurality of memory cells configured to form a plurality of pages;
a peripheral circuit configured to perform first and second program operations on a selected page of the plurality of pages; and
control logic configured to control the peripheral circuit to perform the first and the second program operations, wherein the control logic comprises:
an address controller configured to generate a new address based on a target address on which the first and the second program operations are to be performed; and
a program controller configured to output an operating signal to perform the first and the second program operation based on the new address.

8. The memory device according to claim 7, wherein the peripheral circuit is configured to:
perform the first program operation of programming least significant bit (LSB) page data to a page adjacent to the selected page; and
perform the second program operation of programming center significant bit (CSB) page data and most significant bit (MSB) page data to the selected page.

9. The memory device according to claim 8, wherein the address controller is configured to generate a new address obtained by combining the target address and an address adjacent to the target address.

10. The memory device according to claim 9, wherein the program controller is configured to receive the new address from the address controller, and output an operating signal to perform the first program operation on memory cells corresponding to the address adjacent to the target address included in the new address.

11. The memory device according to claim 10, wherein the program controller is configured to output the operating signal to read data programmed to the memory cells corresponding to the target address.

12. The memory device according to claim 11, wherein the program controller is configured to generate new data by combining the read data, the CSB page data, and the MSB page data.

13. The memory device according to claim 12, wherein the program controller is configured to output the operating signal to perform, based on the new data, the second program operation on memory cells corresponding to the target address.

14. A method of operating a memory device comprising a plurality of memory cells configured to form a plurality of pages, the method comprising:
receiving least significant bit (LSB) page data, center significant bit (CSB) page data, and most significant bit (MSB) page data from a memory controller;
performing a first program operation of programming the LSB page data to a page adjacent to a selected page among the plurality of pages;
and
performing a second program operation of programming, to the selected page, the CSB page data and the MSB page data.

15. The method according to claim 14, wherein the first program operation and the second program operation are performed from a time when a ready/busy signal changes from a first-level state to a second-level state to a time when the ready/busy signal changes back from the second-level state to the first-level state.

16. The method according to claim 14, further comprising, before receiving the LSB page data, the CSB page data, and the MSB page data from the memory controller, generating a new address obtained by combining an address corresponding to the page adjacent to the selected page and an address corresponding to the selected page.

17. The method according to claim 16, wherein the performing of the first program operation comprises programming the LSB page data using the address corresponding to the page adjacent to the selected page, which is included in the new address.

18. The method according to claim 16, wherein the performing of the second program operation comprises programming the data generated by combining, using the address corresponding to the selected page, which is included in the new address.

19. The method according to claim 14, wherein the first program operation starts after all of the LSB page data, the CSB page data, and the MSB page data are received.

20. The method according to claim 14, further comprising, before performing the second program operation, performing a recovery operation of reading data programmed in the selected page.

* * * * *